US011569364B2

(12) United States Patent
Tsai et al.

(10) Patent No.: US 11,569,364 B2
(45) Date of Patent: Jan. 31, 2023

(54) SILICIDE BACKSIDE CONTACT

(71) Applicant: Taiwan Semiconductor Manufacturing Company, Ltd., Hsinchu (TW)

(72) Inventors: Chen-Hung Tsai, Hsinchu (TW); Chen-Ming Lee, Hsinchu (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 109 days.

(21) Appl. No.: 17/103,623

(22) Filed: Nov. 24, 2020

(65) Prior Publication Data

US 2022/0165860 A1  May 26, 2022

(51) Int. Cl.

| H01L 29/45 | (2006.01) |
| H01L 27/088 | (2006.01) |
| H01L 29/775 | (2006.01) |
| H01L 29/49 | (2006.01) |
| H01L 29/417 | (2006.01) |
| H01L 29/40 | (2006.01) |
| H01L 29/78 | (2006.01) |
| H01L 21/8234 | (2006.01) |
| H01L 29/66 | (2006.01) |

(52) U.S. Cl.
CPC .. *H01L 29/4933* (2013.01); *H01L 21/823418* (2013.01); *H01L 21/823431* (2013.01); *H01L 21/823475* (2013.01); *H01L 27/0886* (2013.01); *H01L 29/401* (2013.01); *H01L 29/41791* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 2017/0154973 A1* | 6/2017 | Ching ............... H01L 29/78696 |
| 2019/0378842 A1 | 12/2019 | Reznicek et al. |
| 2020/0013680 A1* | 1/2020 | Leib ............... H01L 21/823431 |
| 2020/0105759 A1 | 4/2020 | Bowonder et al. |

(Continued)

OTHER PUBLICATIONS

Liao, Yi-Bo, et al., "Source/Drain Contact Structure", U.S. Appl. No. 17/093,230, filed Nov. 9, 2020, Assignee: Taiwan Semiconductor Manufacturing Co., Ltd., 50 pages specification, 57 pages drawings.

(Continued)

*Primary Examiner* — Joseph C. Nicely
*Assistant Examiner* — Lamont B Koo
(74) *Attorney, Agent, or Firm* — Haynes and Boone, LLP

(57) ABSTRACT

A semiconductor structure and a method of forming the same are provided. In an embodiment, a semiconductor structure includes a first plurality of channel members over a backside dielectric layer, a second plurality of channel members over the backside dielectric layer, a silicide feature disposed in the backside dielectric layer, and a source/drain feature disposed over the silicide feature and extending between the first plurality of channel members and the second plurality of channel members. The silicide feature extends through an entire depth of the backside dielectric layer.

20 Claims, 25 Drawing Sheets

(56) References Cited

U.S. PATENT DOCUMENTS

2020/0294998 A1* 9/2020 Li .................. H01L 21/823481
2021/0408246 A1* 12/2021 Ganguly ............... H01L 29/401

OTHER PUBLICATIONS

Lung-Kun Chu, et al., "Self-Aligned Backside Source Contact Structure", U.S. Appl. No. 17/016,109, filed Sep. 9, 2020, Assignee: Taiwan Semiconductor Manufacturing Co. Ltd., 31 pages specification, 17 pages drawings.

Huan-Chieh Su, et al., "Backside Power Rail and Methods of Forming the Same", U.S. Appl. No. 16/901,963, Assignee: Taiwan Semiconductor Manufacturing Co., Ltd., 29 pages specification, 22 pages drawings.

Pei-Wei Wang, et al., "Method of Forming Backside Power Rails", U.S. Appl. No. 17/037,274, Assignee: Taiwan Semiconductor Manufacturing Company, Ltd., 29 pages specification, 16 pages drawings.

* cited by examiner

SILICIDE BACKSIDE CONTACT

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the dimensions of the multi-gate devices shrink, packing all contact features on one side of a substrate is becoming more and more challenging. To ease the packing density, it has been proposed to move some routing features, such as power lines (also referred to as power rails) to a backside of the substrate. Some processes for forming backside source/drain contacts may damage the source/drain features. Therefore, while existing backside power rail formation processes may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
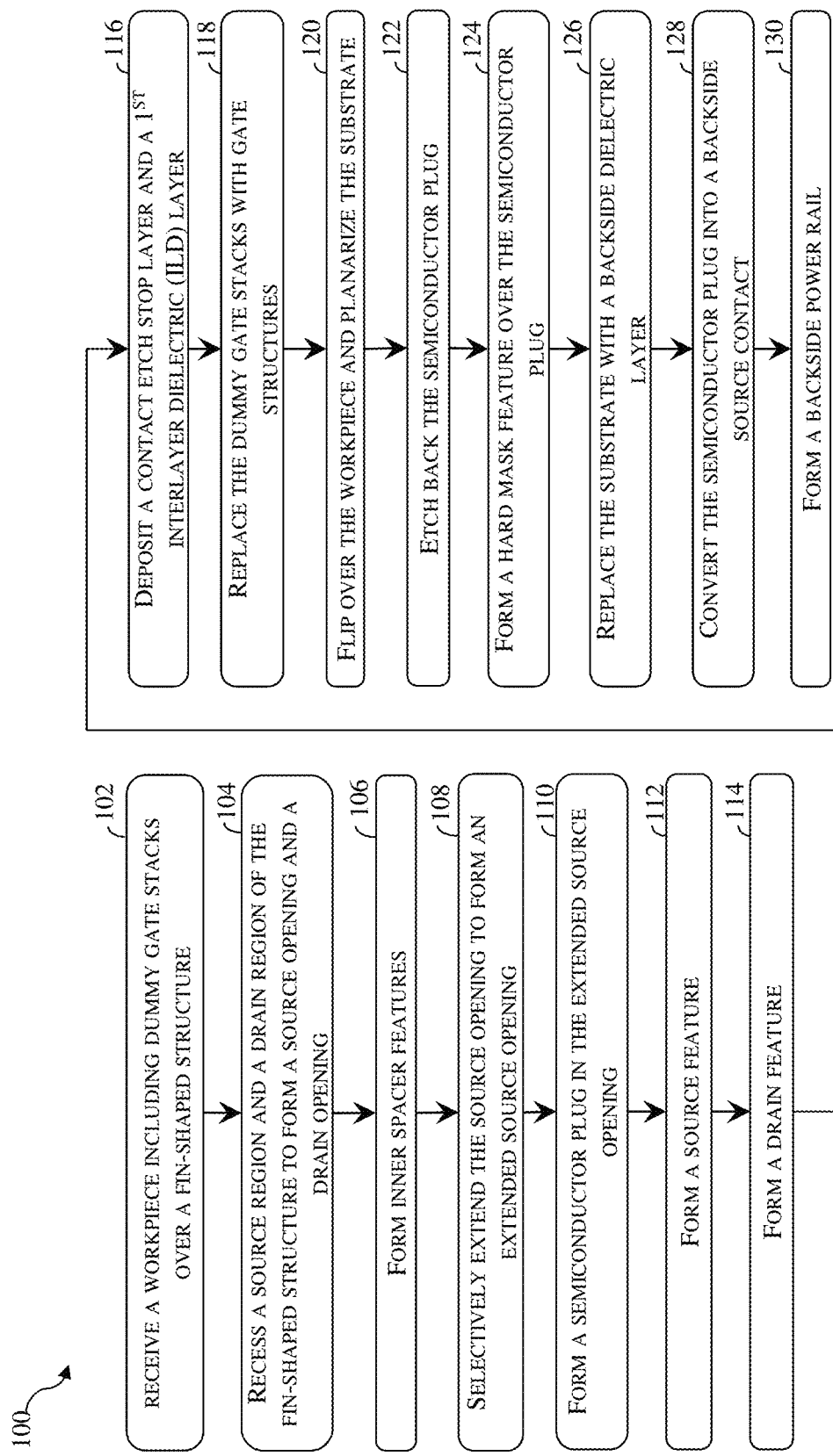
FIG. 1 illustrates a flowchart of a method for forming a semiconductor device having a backside source/drain contact, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to methods of forming a semiconductor device having a backside source/drain contact, and more particularly to methods of forming a backside source/drain contact formed of silicide.

Conventionally, source/drain contacts and gate contacts of transistors on a substrate connect source/drain features of the transistors to an interconnect structure over a front side of the substrate. As the dimensions of IC devices shrink, the close proximity among the source/drain contacts and gate contacts may reduce process windows for forming these contacts and may increase parasitic capacitance among them. The backside power rail (BPR) structure is a modern solution to ease the crowding of contacts. In some conventional processes, after a source/drain feature and a frontside source/drain contact are formed, the substrate is flipped over and a backside contact opening is etched from the back side of the substrate. Because the backside contact opening etches and exposes the source/drain feature, the formation of the backside contact opening involves risks of damaging the source/drain feature. Damages of the source/drain feature may increase contact resistance and may undesirably release needed strain exerted on the channel members.

The present disclosure provides a method for forming a backside source/drain contact for MBC transistors. In an example method, a workpiece is provided. The workpiece includes a fin-shaped structure disposed over a substrate and a dummy gate stack disposed over a channel region of the fin-shaped structure. Using the dummy gate stack as an etch mask, a source region and a drain region of the fin-shaped structure is recessed to form a source opening and a drain opening. The source opening is selectively extended further into the substrate to form an extended source opening. A semiconductor plug is deposited into the extended source opening and a source feature is deposited over the semiconductor plug. After the formation of the source feature, drain feature is deposited in the source opening. The workpiece is then flipped up-side-down with its back side facing up. After the back side of the substrate is planarized to expose the semiconductor plug, a hard mask feature is formed over the exposed semiconductor plug. The substrate is then removed and replaced with a backside dielectric layer. A silicide precursor is then deposited over the semiconductor plug and the backside dielectric layer. An anneal process is them performed to bring about silicidation reaction between the silicide precursor and the semiconductor plug. The silicidation reaction converts the semiconductor plug into a backside source contact that is formed of metal silicide. Because the formation of the backside source contact of the present disclosure does not require removal of the semiconductor plug and exposure of the source feature from the back side, there is no risk associated with damaging the source feature.

The various aspects of the present disclosure will now be described in more detail with reference to the figures. In that regard, FIG. 1 is a flowchart illustrating method 100 of forming a semiconductor device according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2-25, which are fragmentary cross-sectional views of a workpiece 200 at different stages of fabrication according to embodiments of method 100. Because the workpiece 200 will be fabricated into a semiconductor device 200 upon conclusion of the fabrication processes, the workpiece 200 may be referred to as the semiconductor device 200 as the context requires. Additionally, throughout the present application, like reference numerals denote like features, unless otherwise excepted.

Figure 2:
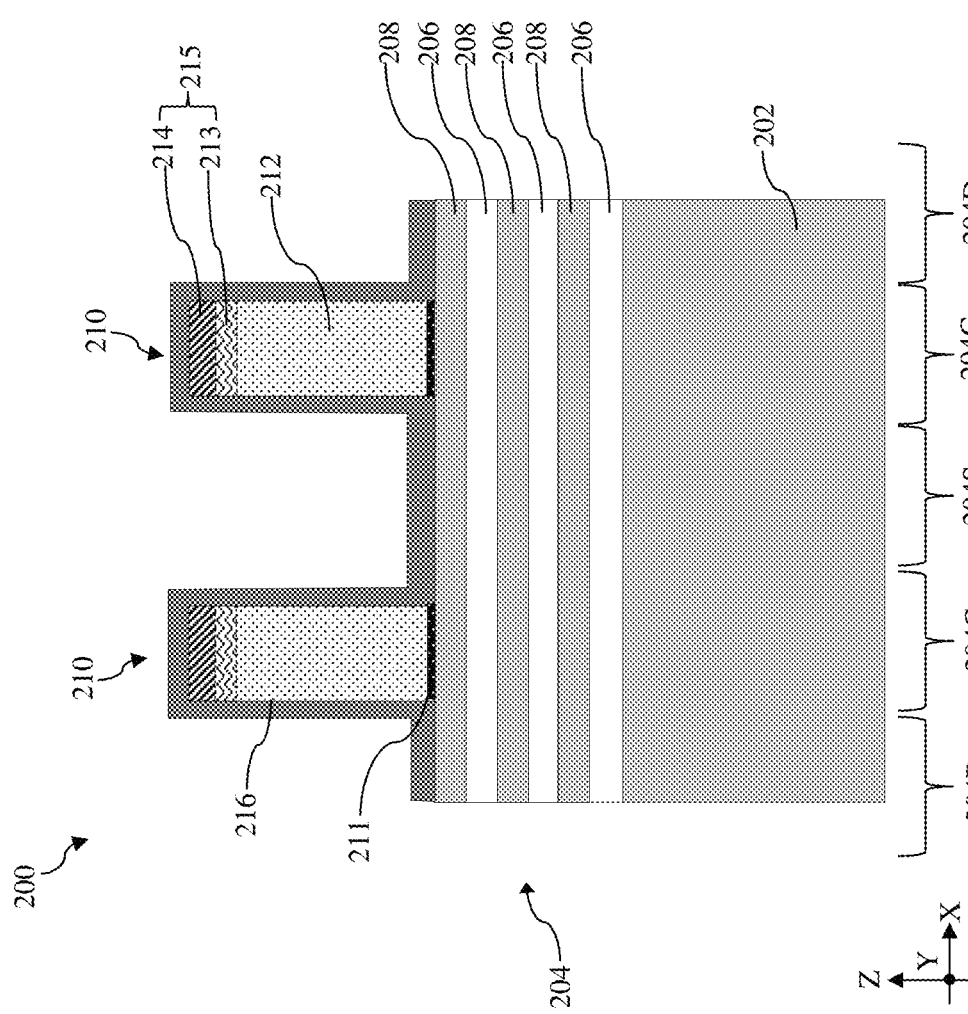
FIGS. 2-25 illustrate fragmentary cross-sectional views of a workpiece during a fabrication process according to the method of FIG. 1, according to one or more aspects of the present disclosure.

Referring to FIGS. 1 and 2, method 100 includes a block 102 where a workpiece 200 is received. In the depicted embodiment, the workpiece 200 includes a substrate 202 and a fin-shaped structure 204 disposed over the substrate 202. The fin-shaped structure 204 extends lengthwise along the X direction and is divided into channel regions 204C, source regions 204S, and drain regions 204D. In FIG. 2, the workpiece 200 also includes dummy gate stacks 210 disposed over channel regions 204C of the fin-shaped structure 204. Two dummy gate stacks 210 are shown in FIG. 2 but the workpiece 200 may include more dummy gate stacks 210. The substrate 202 may be a semiconductor substrate such as a silicon (Si) substrate. The substrate 202 may also include other semiconductor materials such as germanium (Ge), silicon carbide (SiC), silicon germanium (SiGe), or diamond. The fin-shaped structure 204 may be formed from a portion of the substrate 202 and a vertical stack of alternating semiconductor layers using a combination of lithography and etch steps. In some instances, the patterning of the fin-shaped structure 204 may be performed using double-patterning or multi-patterning processes to create patterns having pitches smaller than what is otherwise obtainable using a single, direct photolithography process. The etching process can include dry etching, wet etching, reactive ion etching (RIE), and/or other suitable processes. In the depicted embodiments, the vertical stack of alternating semiconductor layers may include a plurality of channel layers 208 and a plurality of sacrificial layers 206. The plurality of channel layers 208 are interleaved by the plurality of sacrificial layers 206. In some embodiments, the plurality of channel layers 208 may include silicon (Si) and the plurality of sacrificial layers 206 may be formed of silicon germanium (SiGe). The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes.

While not explicitly shown in FIG. 2, an isolation feature 203 (shown in FIG. 23) is also formed around the fin-shaped structure 204 to isolate the fin-shaped structure 204 from an adjacent fin-shaped structure. In some embodiments, the isolation feature is deposited in trenches that define the fin-shaped structure 204. Such trenches may extend through the channel layers 208 and sacrificial layers 206 and terminate in the substrate 202. The isolation feature may also be referred to as a shallow trench isolation (STI) feature. In an example process, a dielectric material for the isolation feature is deposited over the workpiece 200 using CVD, subatmospheric CVD (SACVD), flowable CVD, physical vapor deposition (PVD), spin-on coating, and/or other suitable process. Then the deposited dielectric material is planarized and recessed until the fin-shaped structure 204 rises above the isolation feature. The dielectric material for the isolation feature may include silicon oxide, silicon oxynitride, fluorine-doped silicate glass (FSG), a low-k dielectric, combinations thereof, and/or other suitable materials.

In some embodiments, a gate replacement process (or gate-last process) is adopted where the dummy gate stacks 210 serve as placeholders for functional gate structures. Other processes and configuration are possible. To form the dummy gate stacks 210, a dummy dielectric layer 211, a dummy gate electrode layer 212, and a gate-top hard mask layer 215 are deposited over the workpiece 200. The deposition of these layers may include use of low-pressure CVD (LPCVD), CVD, plasma-enhanced CVD (PECVD), PVD, thermal oxidation, e-beam evaporation, or other suitable deposition techniques, or combinations thereof. The dummy dielectric layer 211 may include silicon oxide. The dummy gate electrode layer 212 may include polysilicon. The gate-top hard mask layer 215 may be a multi-layer that includes a silicon oxide layer 213 and silicon nitride layer 214. Using photolithography and etching processes, the gate-top hard mask layer 215 is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching (e.g., RIE etching), wet etching, and/or other etching methods. Thereafter, using the patterned gate-top hard mask 215 as the etch mask, the dummy dielectric layer 211 and the dummy gate electrode layer 212 are then etched to form the dummy gate stack 210. As shown in FIG. 2, portions of the fin-shaped structure 204 underlying the dummy gate stacks 210 are channel region 204C. The channel regions 204C and the dummy gate stack 210 also define source regions 204S and drain regions 204D that are not vertically overlapped by the dummy gate stacks 210. Each of the channel regions 204C is disposed between a source region 204S and a drain region 204D along the X direction.

As shown in FIG. 2, the workpiece 200 also includes a gate spacer layer 216 disposed along sidewalls of the dummy gate stacks 210 and top surfaces of the fin-shaped structure 204. In some embodiments, the formation of the gate spacer layer 216 includes conformal deposition of one or more dielectric layers over the workpiece 200. In an example process, the one or more dielectric layers for the gate spacer layer 216 are deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof.

Figure 3:
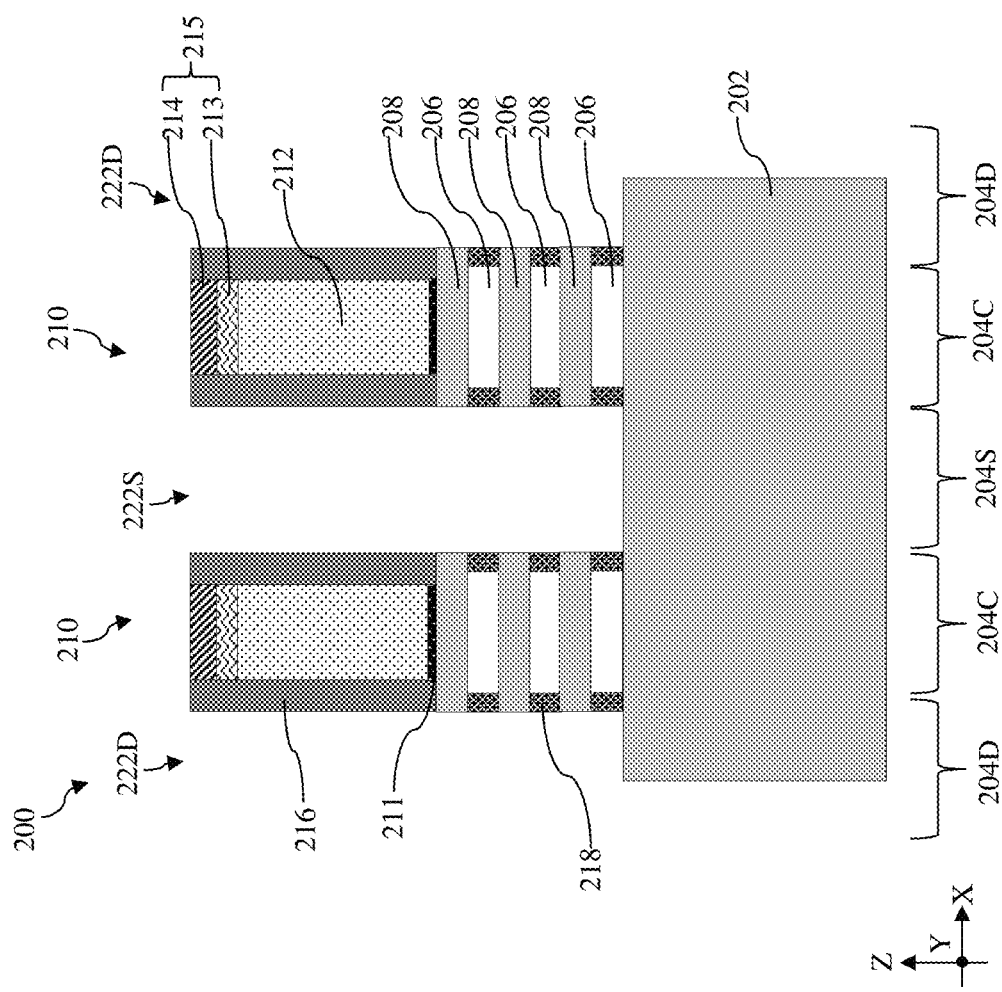

Referring to FIGS. 1 and 3, method 100 includes a block 104 where a source region 204S and a drain region 204D of the fin-shaped structure 204 are recessed to form a source opening 222S and a drain opening 222D. After the deposition of the gate spacer layer 216, the dummy gate stacks 210 and the gate spacer layer 216 along sidewalls of the dummy gate stacks serve as an etch mask in an etch process that anisotropically etches the source regions 204S and the drain regions 204D of the fin-shaped structure 204. The anisotropic etching of the source regions 204S and the drain regions 204D results in source openings 222S and drain openings 222D, respectively. The etch process at block 104 may be a dry etch process or a suitable etch process. An example dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $C_{12}$, $CHCl_3$, $CCl_4$, and/or $BCl_3$), a bromine-containing gas (e.g., $HBr$ and/or $CHBr_3$), an iodine-containing gas, other suitable gases and/or plasmas, and/or combinations thereof. In embodiments represented in FIG. 3, the source openings 222S and the drain openings 222D extend through vertical stack of channel layers 208 and sacrificial layers 206. In some implementations not explicitly shown in the figures, the source openings 222S and the drain openings 222D may partially extend into the substrate 202. Sidewalls of the channel layers 208 and the sacrificial layers 206 are exposed in the source openings 222S and the drain openings 222D.

Referring to FIGS. 1 and 3, method 100 includes a block 106 where inner spacer features 218 are formed. After the formation of the source openings 222S and the drain openings 222D, the sacrificial layers 206 exposed in the source openings 222S and the drain openings 222D are selectively and partially recessed to form inner spacer recesses (being filled with the inner spacer features 218 in FIG. 3), while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include use of a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include an APM etch (e.g., ammonia hydroxide-hydrogen peroxide-water mixture). After the formation of the inner spacer recesses, an inner spacer material layer is deposited over the workpiece 200, including in the inner spacer recesses. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over sidewalls of the channel layers 208, thereby forming the inner spacer features 218 as shown in FIG. 3. In some embodiments, the etch back process at block 106 may be a dry etch process that includes use of an oxygen-containing gas, hydrogen, nitrogen, a fluorine-containing gas (e.g., $CF_4$, $SF_6$, $CH_2F_2$, $CHF_3$, and/or $C_2F_6$), a chlorine-containing gas (e.g., $C_{12}$, $CHCl_3$, $CCl_4$, and/or $BCl_3$), a bromine-containing gas (e.g., $HBr$ and/or $CHBr_3$), an iodine-containing gas (e.g., $CF_3I$), other suitable gases and/or plasmas, and/or combinations thereof.

Figure 4:
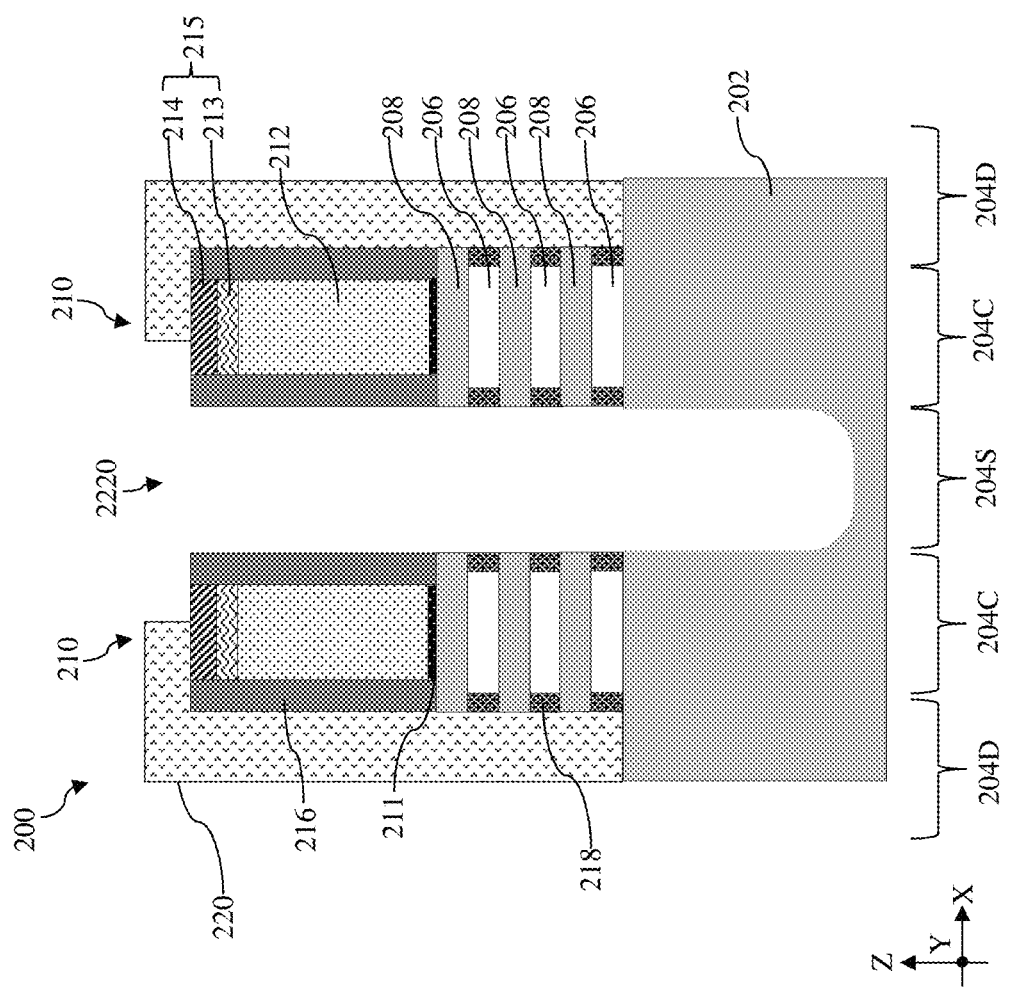

Referring to FIGS. 1 and 4, method 100 includes a block 108 where the source opening 222S is selectively extended into the substrate 202 to form an extended source opening 222O. At block 108, a first mask film 220 is formed over the workpiece 200, as shown in FIG. 4. The first mask film 220 may be a hard mask layer. The first mask film 220 may include silicon oxide, silicon nitride, silicon oxynitride, silicon oxycarbonitride, silicon carbide, or silicon oxycarbide. In an example process, a dielectric material is deposited over the workpiece using CVD or ALD to form the first mask film 220 and then a photoresist layer is deposited over the first mask film 220 using spin-on coating or a suitable process. The photoresist layer is patterned using photolithography processes to form a patterned photoresist layer. The patterned photoresist layer is then applied as an etch mask in an etch process to pattern the first mask film 220. As shown in FIG. 4, the patterned first mask film 220 cover/protect the drain openings 222D while the source opening 222S is exposed. An anisotropic etch process is then performed to extend the source opening 222S further into the substrate 202 to form an extended source opening 222O. In some instances, the extended source opening 222O may extend between about 15 nanometer (nm) and about 35 nm into the substrate 202. In some implementations, the anisotropic etch process at block 108 may be a dry etch process that uses an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $C_{12}$, $CHCl_3$, $CCl_4$, and/or $BCl_3$), a bromine-containing gas (e.g., $HBr$ and/or $CHBR_3$), an iodine-containing gas, other suitable gases and/or plasmas, and/or combinations thereof.

Figure 5:
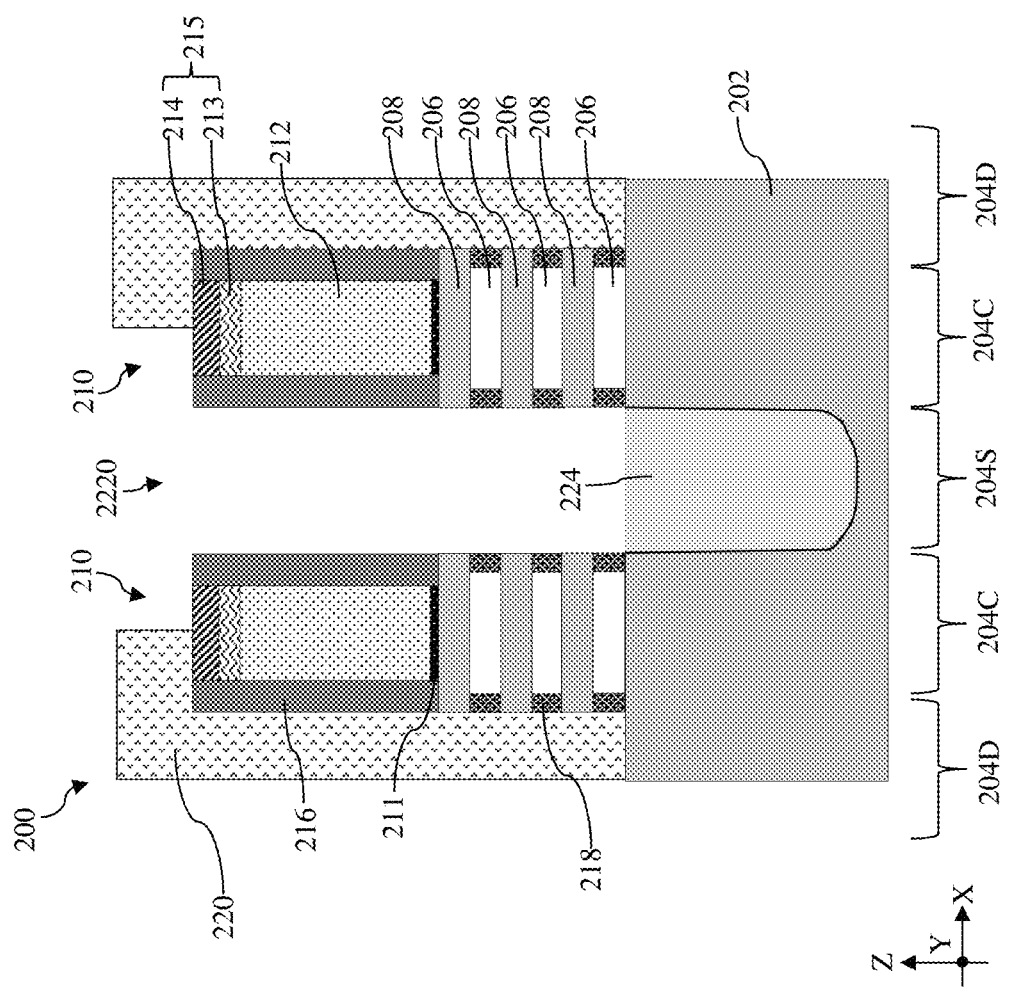

Referring to FIGS. 1 and 5, method 100 includes a block 110 where a semiconductor plug 224 is formed in the extended source opening 222O. With the first mask film 220 still covering sidewalls of the drain openings 222D, a semiconductor material for the semiconductor plug 224 may be deposited in the extended source opening 222O using molecular beam epitaxy (MBE), vapor-phase epitaxy (VPE), ultra-high vacuum CVD (UHV-CVD)), and/or other suitable epitaxial growth processes. In an example process, the semiconductor material may be deposited not only on the exposed surfaces of the substrate 202 in the extended source opening 2220 but also on exposed sidewalls of the channel layers 208. An etch back process may then be performed to remove the semiconductor material deposited on sidewalls of the channel layers 208 to form the semiconductor plug 224, as illustrated in FIG. 5. While the top surface of the semiconductor plug 224 is shown as being flat, it may be concave as a result of the etch back process. The etch back process may include a dry etch process, a wet etch process, or a combination of both. In some embodiments, the etch back process may be performed such that a top surface of the semiconductor plug 224 is lower than the top surface of the substrate 202 along the Z direction. The semiconductor plug 224 may be formed of silicon germanium (SiGe). To provide etch selectivity to the semiconductor plug 224, the semiconductor plug 224 may have a higher germanium concentration than the source feature 230 (shown in FIG. 7, to be described below). For example, when an n-type MBC transistor is desired, the source feature 230 is formed of silicon and is substantially free of germanium (Si) while the semiconductor plug 224 is formed of silicon germanium (SiGe) with between about 15% and 45% of germanium (Ge). When a p-type MBC transistor is desired, the source feature 230 is formed of silicon germanium (SiGe) with between about 15% and about 30% of germanium (Ge) while the semiconductor plug 224 is formed of silicon germanium (SiGe) with between about 35% and 45% of germanium (Ge).

Figure 6:
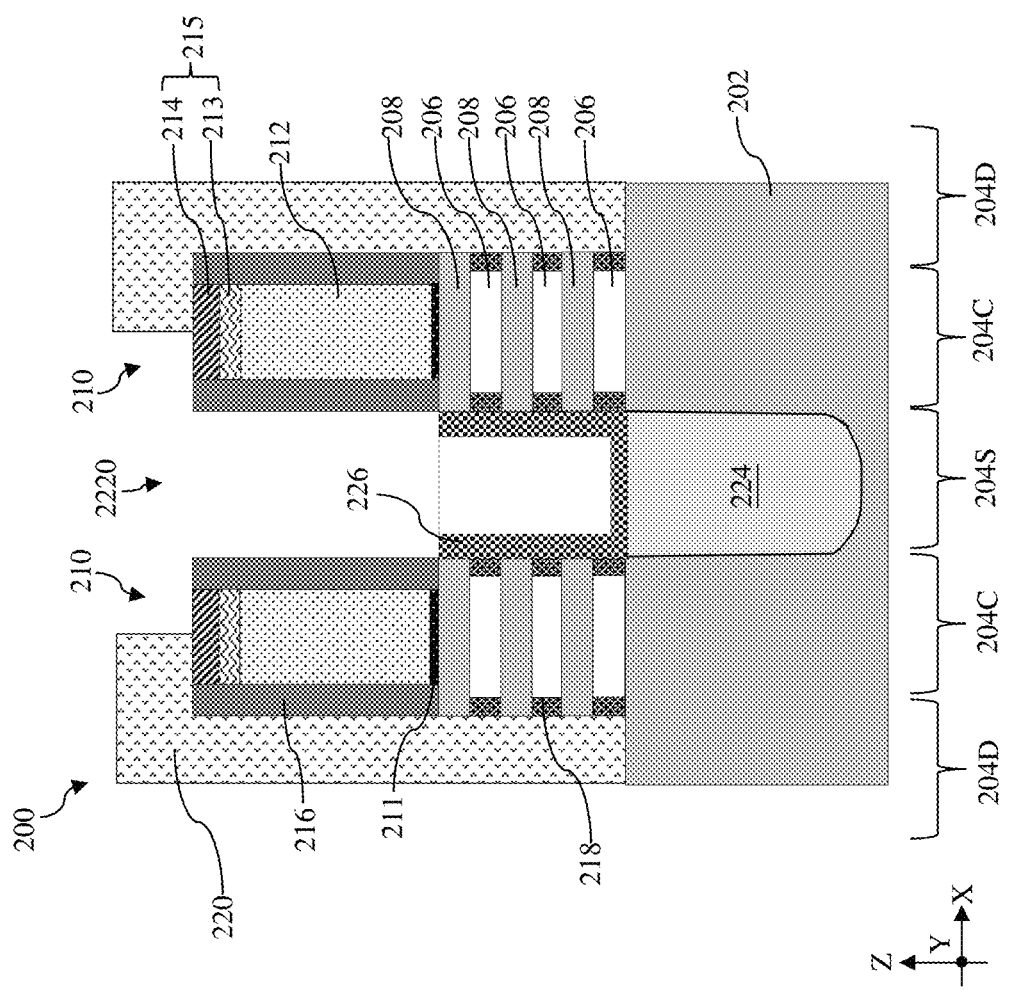
Figure 7:
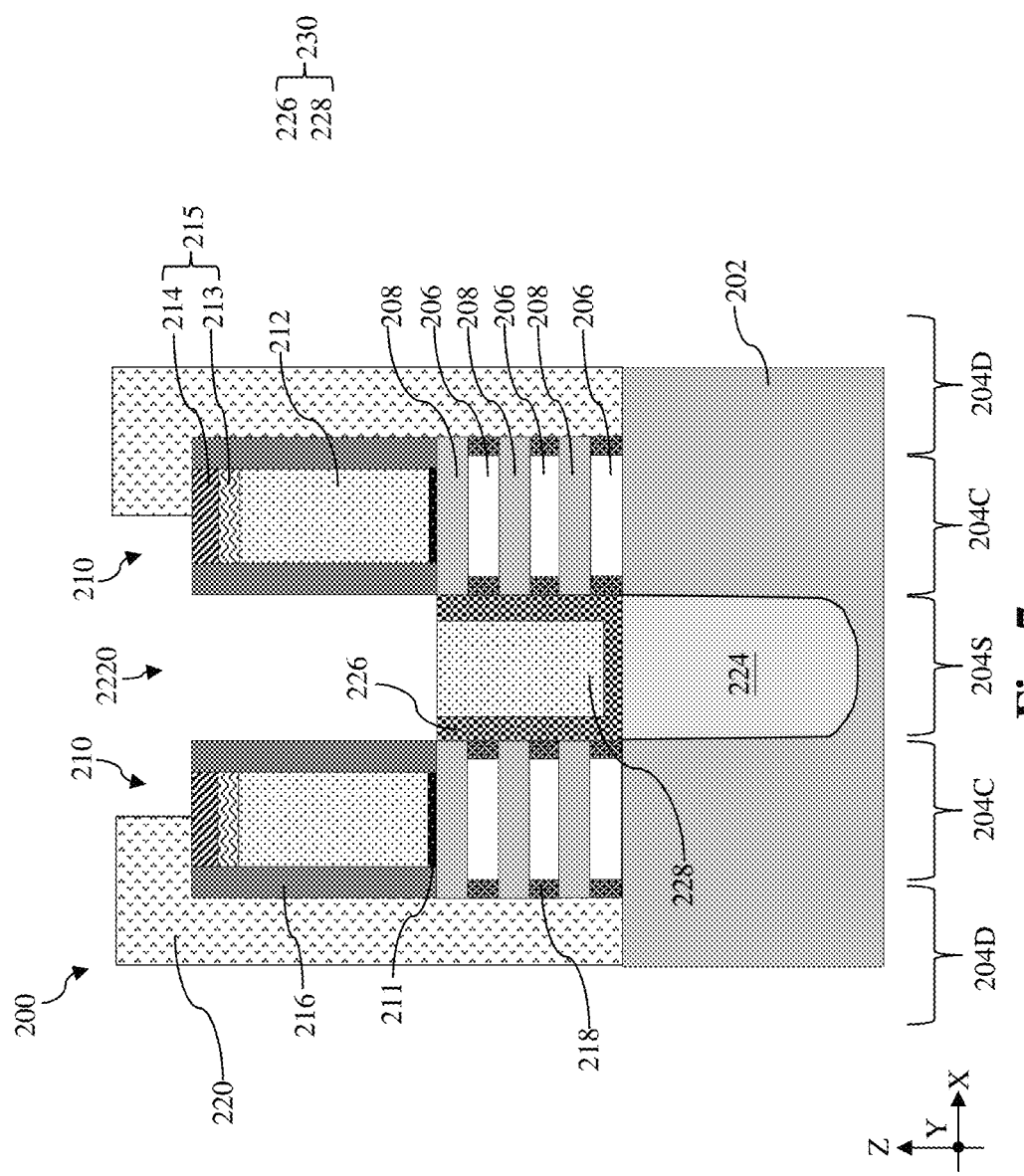

Referring to FIGS. 1, 6 and 7, method 100 includes a block 112 where a source features 230 are formed in the extended source opening 2220 to be in contact with sidewalls of the channel layers 208. In some embodiments, the source feature 230 includes a first epitaxial layer 226 and a second epitaxial layer 228 disposed on the first epitaxial layer 226. Because the second epitaxial layer 228 is spaced apart from the sidewalls of the channel layers 208 by the first epitaxial layer 226, the first epitaxial layer 226 may also be referred to as an outer layer 226 and the second epitaxial layer 228 may also be referred to as an inner layer 228. Reference is first made to FIG. 6. In some embodiments, the first epitaxial layer 226 may be deposited using an epitaxial deposition process, such as VPE, UHV-CVD, MBE, and/or other suitable processes. The epitaxial growth process may use gaseous and/or liquid precursors, which selectively interact with the semiconductor composition of the channel layers 208 and semiconductor plug 224. That is, the first epitaxial layer 226 is deposited on exposed surfaces of the channel layers 208 and the surface of the semiconductor plug 224. In some instances, overgrowth of the first epitaxial layer 226 may extend over the inner spacer features 218. As a result, the first epitaxial layer 226 may come in direct contact with the inner spacer features 218. The first epitaxial layer 226 is therefore coupled to the channel layers 208. Reference is then made to FIG. 7. A second epitaxial layer 228 is then deposited over the first epitaxial layer 226 using an epitaxial deposition process, such as VPE, UHV-CVD, MBE, and/or other suitable processes. The epitaxial growth process may use gaseous and/or liquid precursors, which selectively interact with the semiconductor composition of the first epitaxial layer 226. In the depicted embodiment, the second epitaxial layer 228 may be spaced apart from the channel layers 208 by the first epitaxial layer 226. The first epitaxial layer 226 and the second epitaxial layer 228 may be collectively referred to as the source feature 230.

Depending on the conductivity type of the to-be-formed MBC transistor, the first epitaxial layer 226 and the second epitaxial layer 228 may be n-type or p-type. Example n-type epitaxial layers may include silicon (Si), phosphorus-doped silicon (Si:P), arsenic-doped silicon (Si:As), antimony-doped silicon (Si:Sb), or other suitable material and may be in-situ doped during the epitaxial process by introducing an n-type dopant, such as phosphorus (P), arsenic (As), or antimony (Sb). Example p-type epitaxial layers may include germanium (Ge), gallium-doped silicon germanium (SiGe:Ga), boron-doped silicon germanium (SiGe:B), or other suitable material and may be in-situ doped during the epitaxial process by introducing a p-type dopant, such as boron (B) or gallium (Ga). While the first epitaxial layer 226 and the second epitaxial layer 228 of a given MBC transistor are of the same conductivity type, they may have different doping concentrations to reduce contact resistance. For example, when an n-type MBC transistor is desired, the first epitaxial layer 226 and the second epitaxial layer 228 may include phosphorus-doped silicon (Si:P) and a phosphorus (P) doping concentration in the second epitaxial layer 228 is greater than a phosphorus (P) doping concentration in the first epitaxial layer 226. When a p-type MBC transistor is desired, the first epitaxial layer 226 and the second epitaxial layer 228 may include boron-doped silicon germanium (SiGe:B) and a boron (B) doping concentration in the second epitaxial layer 228 is greater than a boron (B) doping concentration in the first epitaxial layer 226.

As described above, the source feature 230, particularly, the first epitaxial layer 226, has a smaller germanium concentration than the semiconductor plug 224. For example, when an n-type MBC transistor is desired, the first epitaxial layer 226 is formed of silicon and is substantially free of germanium (Si) while the semiconductor plug 224 is formed of silicon germanium (SiGe) with between about 15% and 45% of germanium (Ge). When a p-type MBC transistor is desired, the first epitaxial layer 226 is formed of silicon germanium (SiGe) with between about 15% and about 30% of germanium (Ge) while the semiconductor plug 224 is formed of silicon germanium (SiGe) with between about 35% and 45% of germanium (Ge).

Figure 8:
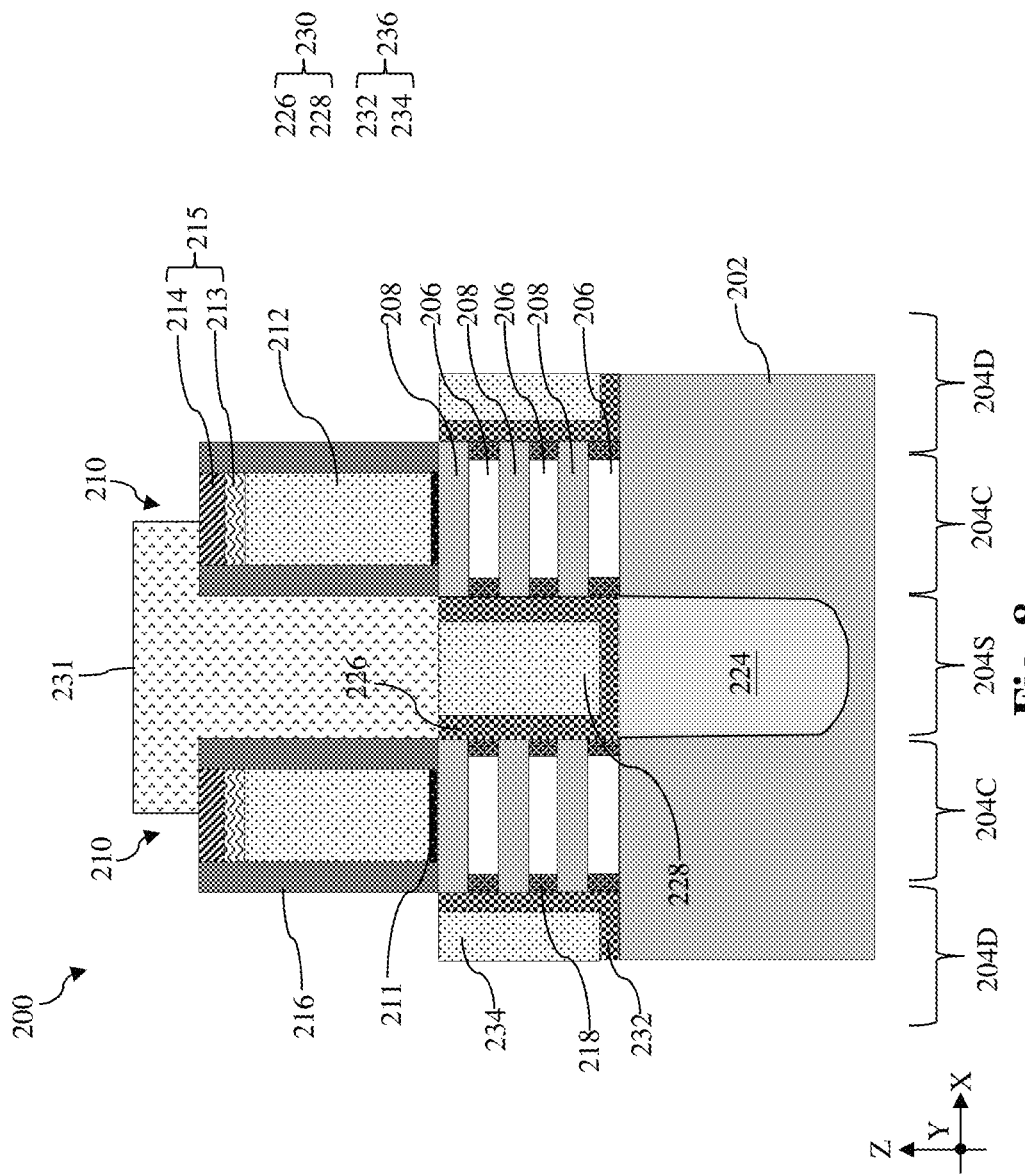

Referring to FIGS. 1 and 8, method 100 includes a block 114 where a drain feature 236 is formed over the drain region 204D. At block 114, a second mask film 231 is formed over the workpiece 200, as shown in FIG. 8. The second mask film 231 may be a patterned hard mask layer. The second mask film 231 may include silicon oxide, silicon nitride, silicon oxynitride, silicon oxycarbonitride, silicon carbide, or silicon oxycarbide. In an example process, a dielectric material is deposited over the workpiece using CVD or ALD to form the second mask film 231 and then a photoresist layer is deposited over the second mask film 231 using spin-on coating or a suitable process. The photoresist layer is patterned using photolithography processes to form a patterned photoresist layer. The patterned photoresist layer is then applied as an etch mask in an etch process to pattern the second mask film 231. As shown in FIG. 8, the patterned second mask film 231 cover/protect the source feature 230 while the drain opening 222D is exposed.

In some embodiments, the drain feature 236 includes a third epitaxial layer 232 and a fourth epitaxial layer 234 disposed on the third epitaxial layer 232. Because the fourth epitaxial layer 234 is spaced apart from the sidewalls of the channel layers 208 by the third epitaxial layer 232, the third epitaxial layer 232 may also be referred to as an outer layer 232 and the fourth epitaxial layer 234 may also be referred to as an inner layer 234. The formation and composition of the third epitaxial layer 232 may be similar to those of the first epitaxial layer 226. In some embodiments, the third epitaxial layer 232 may be deposited using an epitaxial deposition process, such as VPE, UHV-CVD, MBE, and/or other suitable processes. The epitaxial growth process may use gaseous and/or liquid precursors, which selectively interact with the semiconductor composition of the channel layers 208 and the substrate 202. That is, the third epitaxial layer 232 is deposited on exposed surfaces of the channel layers 208 and the surface of the substrate 202. In some instances, overgrowth of the third epitaxial layer 232 may extend over the inner spacer features 218. As a result, the third epitaxial layer 232 may come in direct contact with the inner spacer features 218. The third epitaxial layer 232 is therefore coupled to the channel layers 208. The fourth epitaxial layer 234 is then deposited over the third epitaxial layer 232 using an epitaxial deposition process, such as VPE, UHV-CVD, MBE, and/or other suitable processes. The epitaxial growth process may use gaseous and/or liquid precursors, which selectively interact with the semiconductor composition of the third epitaxial layer 232. In the depicted embodiment, the fourth epitaxial layer 234 may be spaced apart from the channel layers 208 by the third epitaxial layer 232. The third epitaxial layer 232 and the fourth epitaxial layer 234 may be collectively referred to as the drain feature 236.

Depending on the conductivity type of the to-be-formed MBC transistor, the third epitaxial layer 232 and the fourth epitaxial layer 234 may be n-type or p-type. Example n-type epitaxial layers may include silicon (Si), phosphorus-doped silicon (Si:P), arsenic-doped silicon (Si:As), antimony-doped silicon (Si:Sb), or other suitable material and may be in-situ doped during the epitaxial process by introducing an n-type dopant, such as phosphorus (P), arsenic (As), or antimony (Sb). Example p-type epitaxial layers may include germanium (Ge), gallium-doped silicon germanium (SiGe:Ga), boron-doped silicon germanium (SiGe:B), or other suitable material and may be in-situ doped during the epitaxial process by introducing a p-type dopant, such as boron (B) or gallium (Ga). While the third epitaxial layer 232 and the fourth epitaxial layer 234 of a given MBC transistor are of the same conductivity type, they may have different doping concentrations to reduce contact resistance. For example, when an n-type MBC transistor is desired, the third epitaxial layer 232 and the fourth epitaxial layer 234 may include phosphorus-doped silicon (Si:P) and a phosphorus (P) doping concentration in the fourth epitaxial layer 234 is greater than a phosphorus (P) doping concentration in the third epitaxial layer 232. When a p-type MBC transistor is desired, the third epitaxial layer 232 and the fourth epitaxial layer 234 may include boron-doped silicon germanium (SiGe:B) and a boron (B) doping concentration in the fourth epitaxial layer 234 is greater than a boron (B) doping concentration in the third epitaxial layer 232.

Figure 9:
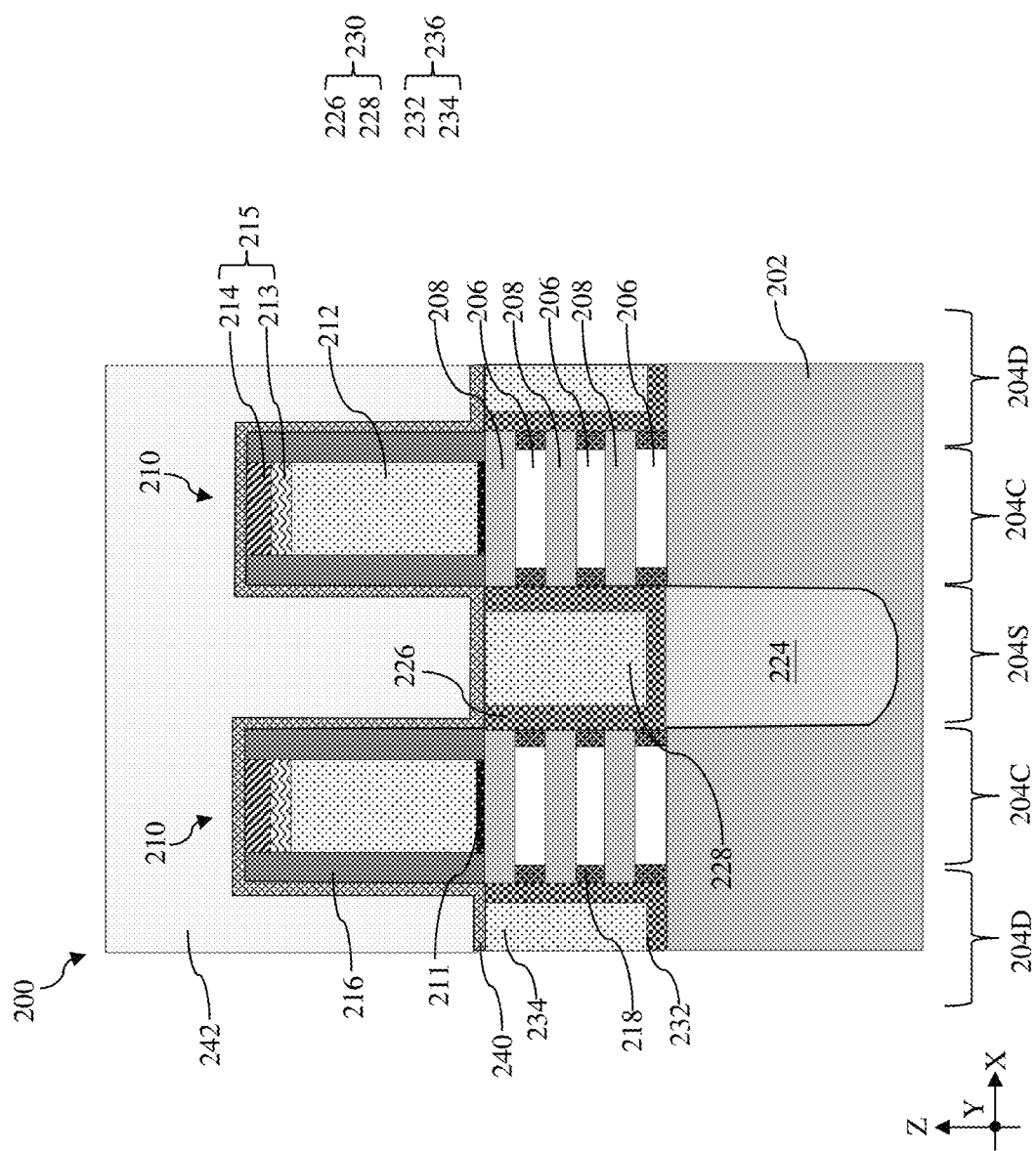

Referring to FIGS. 1 and 9, method 100 includes a block 116 where a contact etch stop layer (CESL) 240 and a first interlayer dielectric layer 242 are deposited. The CESL 240 may include silicon nitride, silicon oxynitride, and/or other materials known in the art and may be formed by ALD, plasma-enhanced chemical vapor deposition (PECVD) process and/or other suitable deposition or oxidation processes. As shown in FIG. 9, the CESL 240 may be deposited on top surfaces of the source feature 230 (including the first epitaxial layer 226 and the second epitaxial layer 228), the drain features 236 (including the third epitaxial layer 232 and the fourth epitaxial layer 234), and sidewalls of the gate spacer layer 216. The first ILD layer 242 is then deposited by a PECVD process or other suitable deposition technique over the workpiece 200 after the deposition of the CESL 240. The first ILD layer 242 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the first ILD layer 242, the workpiece 200 may be annealed to improve integrity of the first ILD layer 242.

Figure 10:
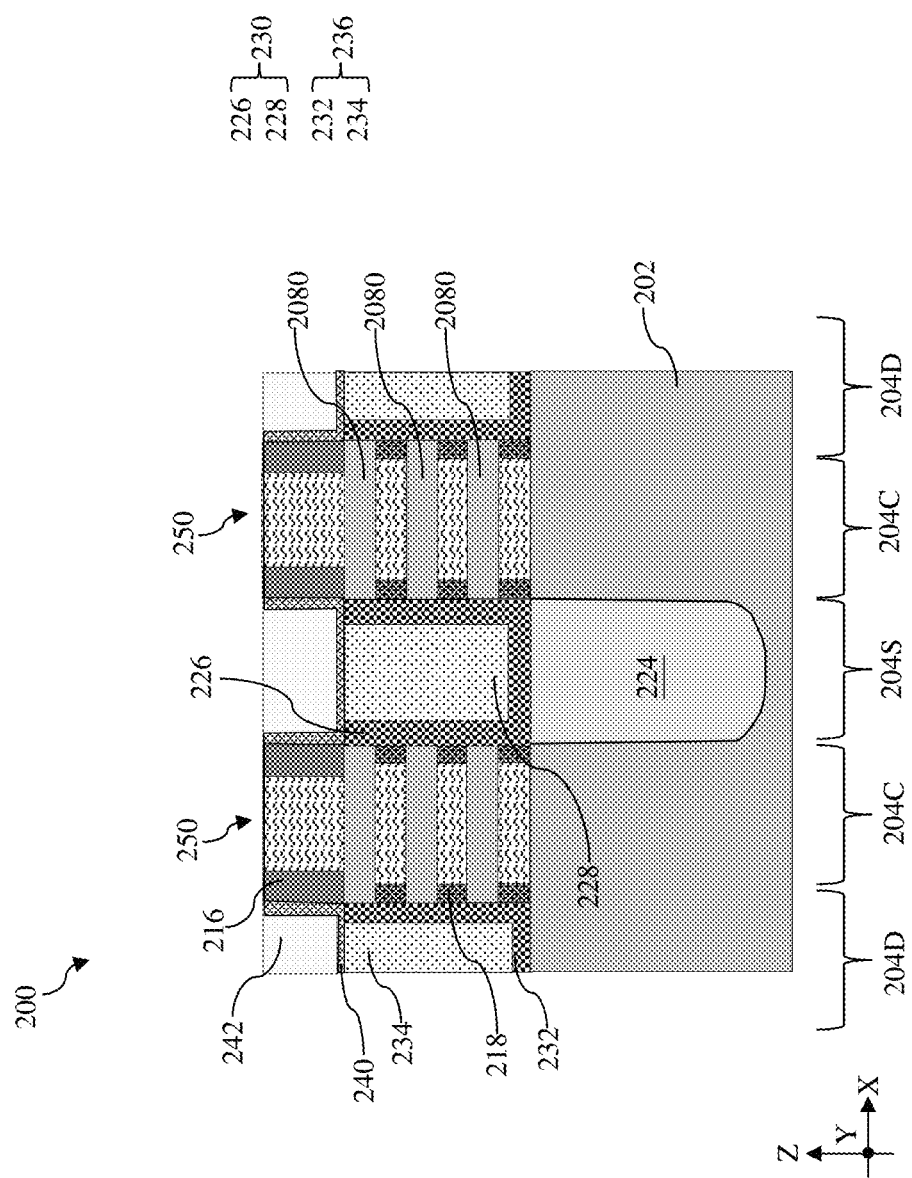

Referring to FIGS. 1 and 10, method 100 includes a block 118 where the dummy gate stacks 210 are replaced with gate structures 250. To remove excess materials and to expose top surfaces of the dummy gate stacks 210, a planarization process, such a chemical mechanical polishing (CMP) process may be performed to the workpiece 200. With the exposure of the dummy gate stacks 210, block 118 proceeds to removal of the dummy gate stacks 210. The removal of the dummy gate stacks 210 may include one or more etching processes that are selective to the material in the dummy gate stacks 210. For example, the removal of the dummy gate stacks 210 may be performed using as a selective wet etch, a selective dry etch, or a combination thereof. After the removal of the dummy gate stacks 210, sidewalls and top surfaces of the channel layers 208 and the sacrificial layers 206 are exposed in the channel regions 204C. After the removal of the dummy gate stacks 210, the sacrificial layers 206 in the channel regions 204C are selectively removed to release the channel layers 208 as channel members 208O. In some example processes, the sacrificial layers 206 may be removed using selective dry etch process or selective wet etch process. The selective dry etch process may include use of one or more fluorine-based etchants, such as fluorine gas or hydrofluorocarbons. The selective wet etching process may include an APM etch (e.g., ammonia hydroxide-hydrogen peroxide-water mixture).

Block 118 also includes operations to deposit gate structures 250 in the channel regions 204C. As shown in FIG. 10, each of the gate structures 250 is deposited to wrap around each of the channel members 208O. Each of the gate structures 250 may include an interfacial layer, a gate dielectric layer over the interfacial layer and a gate electrode layer over the gate dielectric layer. In some embodiments, the interfacial layer includes silicon oxide and may be formed in a pre-clean process. An example pre-clean process may include use of RCA SC-1 (a mixture of ammonium hydroxide, hydrogen peroxide and water) and/or RCA SC-2 (a mixture of hydrochloric acid, hydrogen peroxide and water). The gate dielectric layer may also be referred to a high-k dielectric layer, as it is formed of a dielectric material having a dielectric constant greater than that of silicon dioxide, which is about 3.9. The gate dielectric layer may be deposited over the interfacial layer using ALD, CVD, and/or other suitable methods. The gate dielectric layer may include hafnium oxide. Alternatively, the gate dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

The gate electrode layer is then deposited over the gate dielectric layer using ALD, PVD, CVD, e-beam evaporation, or other suitable methods. The gate electrode layer may include a single layer or alternatively a multi-layer structure, such as various combinations of a metal layer with a selected work function to enhance the device performance (work function metal layer), a liner layer, a wetting layer, an first adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. Further, where the semiconductor device 200 includes n-type MBC transistors and p-type MBC transistors, different gate electrode layers may be formed separately for n-type MBC transistors and p-type MBC transistors, which may include different work function metal layers (e.g., for providing different n-type and p-type work function metal layers). In some instances, the workpiece 200 may be subject to a CMP process to provide a planar top surface.

Figure 11:
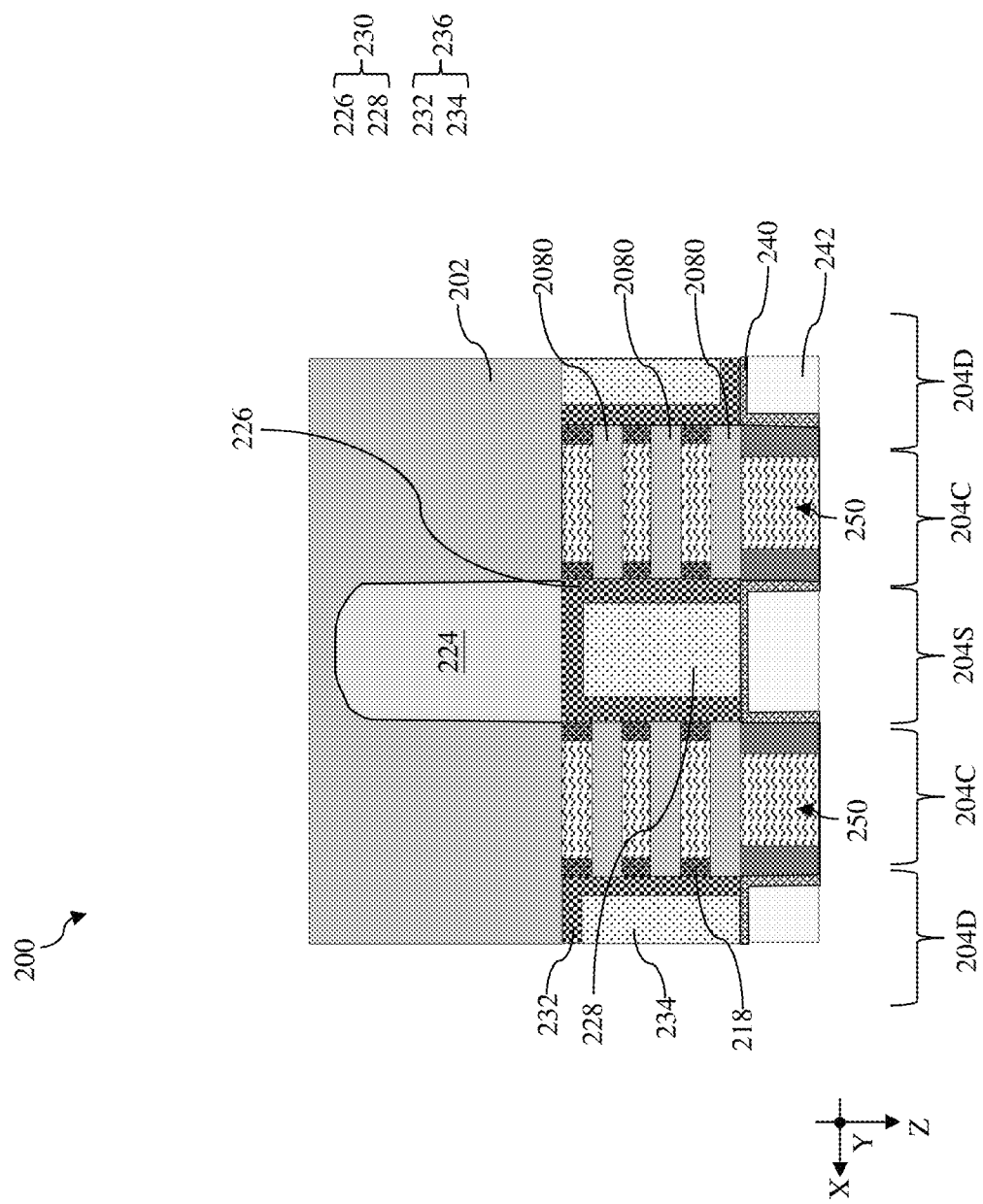
Figure 12:
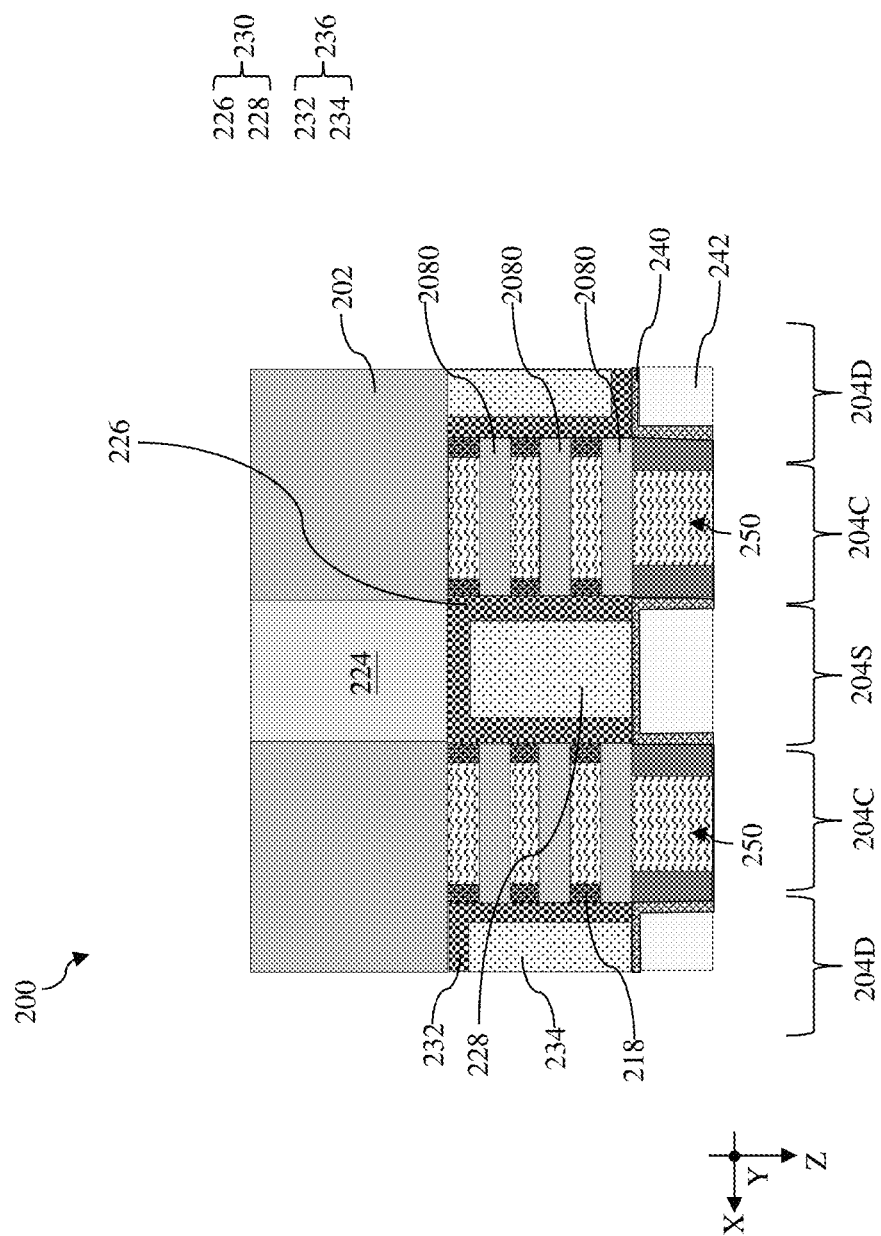

Referring to FIGS. 1, 11 and 12, method 100 includes a block 120 where the workpiece 200 is flipped over and the substrate 202 is planarized. Operations at block 120 may be performed with a back side of the workpiece 200 facing up. In an example process to flip the workpiece 200 over, a carrier substrate is bonded to the front side of the workpiece 200 or an interconnect structure (not explicitly shown) formed on the front side of the workpiece 200. The workpiece 200 is then flipped over along with the carrier substrate. In some instances, the carrier substrate may be bonded to the workpiece 200 by fusion bonding, by use of an adhesion layer, or a combination thereof. In some instances, the carrier substrate may be formed of semiconductor materials (such as silicon), sapphire, glass, polymeric materials, or other suitable materials. In embodiments where fusion bonding is used, the carrier substrate includes a bottom oxide layer and the workpiece 200 (or the interconnect structure thereon, if formed)) includes a top oxide layer. After both the bottom oxide layer and top oxide layer are treated, they are placed in plush contact with one another for direct bonding at room temperature or at an elevated temperature. After the carrier substrate is bonded to the workpiece 200 (or the interconnect structure, if formed), the workpiece 200 is flipped up-side-down, as representatively shown in FIG. 11. After the workpiece 200 is flipped over, a back side of the workpiece 200 is planarized using a CMP process until the isolation feature and the semiconductor plug 224 are exposed, as shown in FIG. 12.

Figure 13:
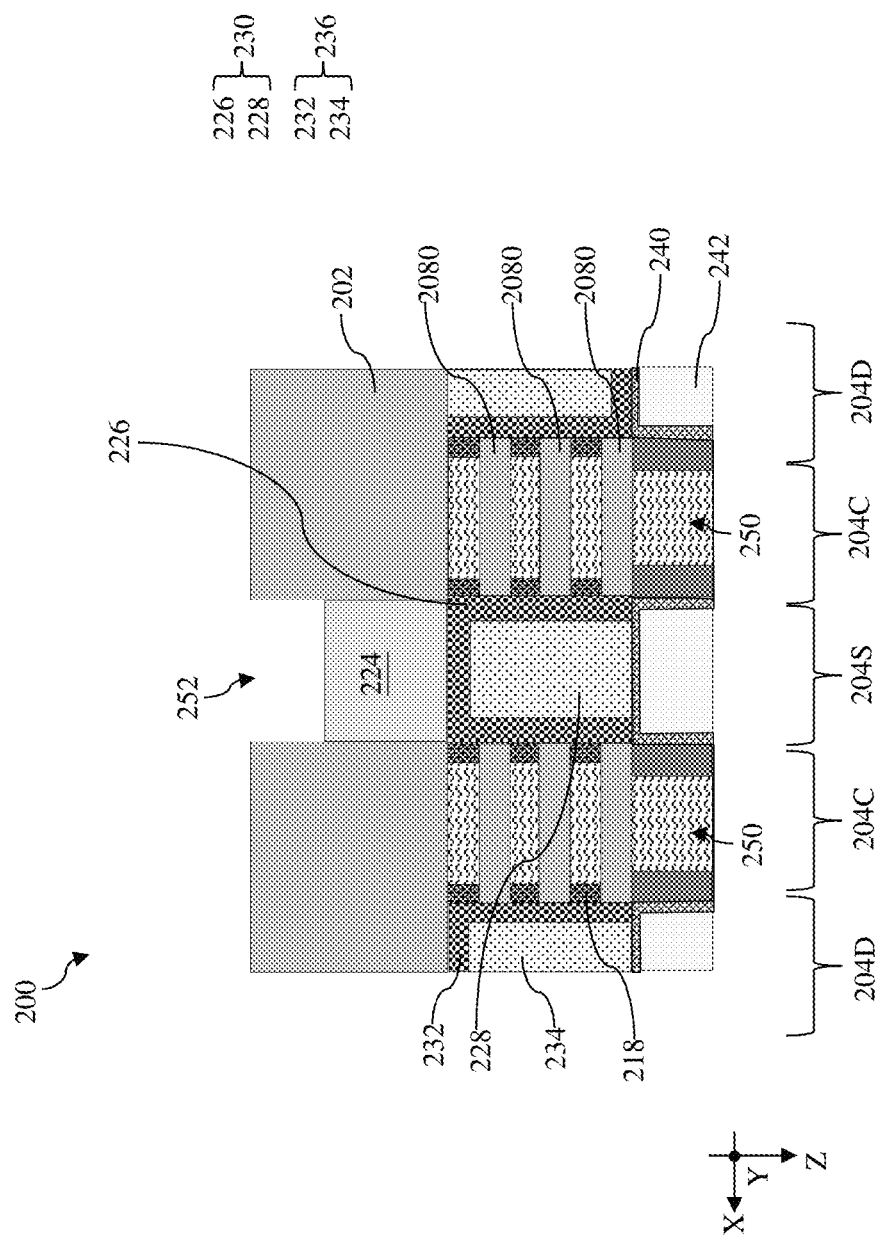

Referring to FIGS. 1 and 13, method 100 includes a block 122 where the semiconductor plug 224 is etched back. In some embodiments, the etch back at block 122 may be performed using an isotropic etch process. For example, the etch back at block 122 may include an APM etch (e.g., ammonia hydroxide-hydrogen peroxide-water mixture) that etches silicon germanium (SiGe) faster than it does silicon (Si). As shown in FIG. 13, the etch back at block 122 forms a recess 252.

Figure 14:
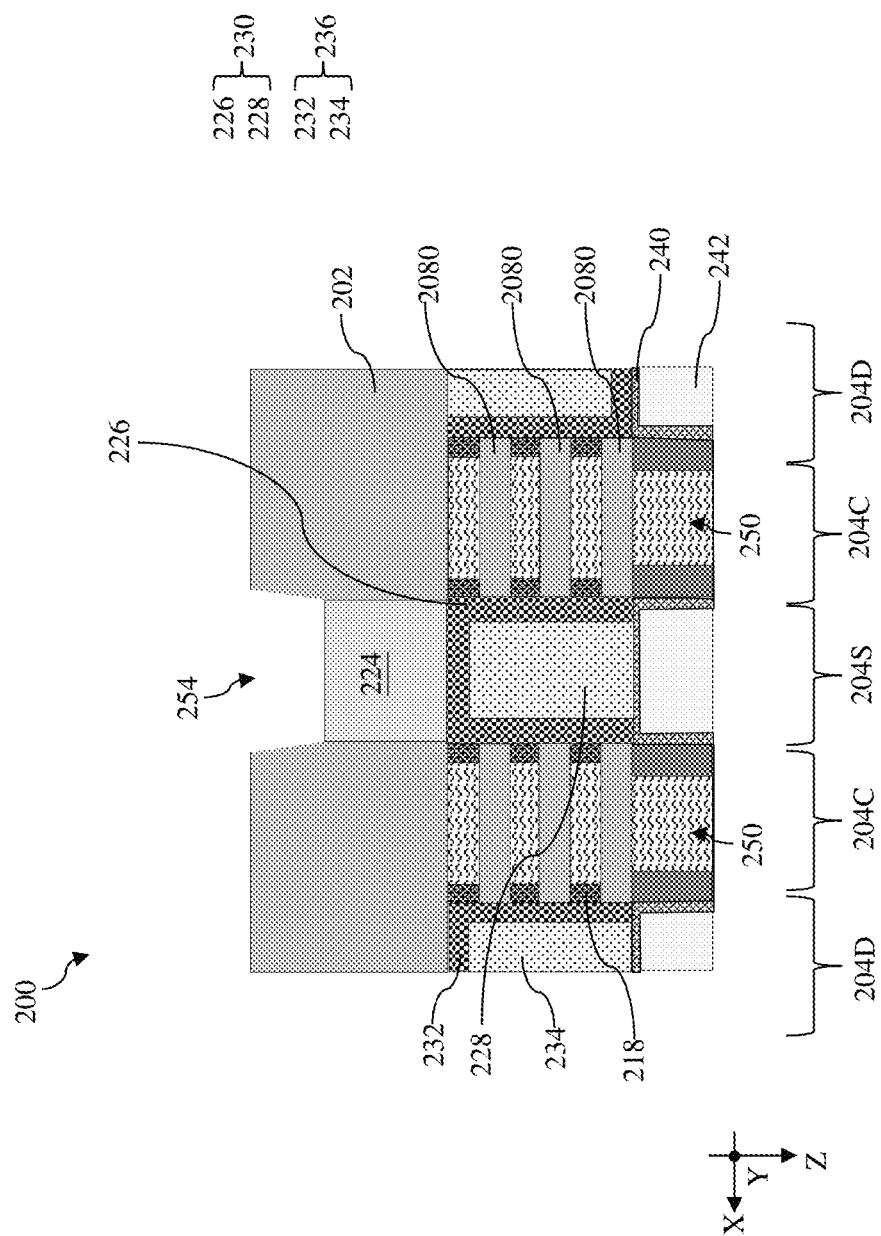
Figure 15:
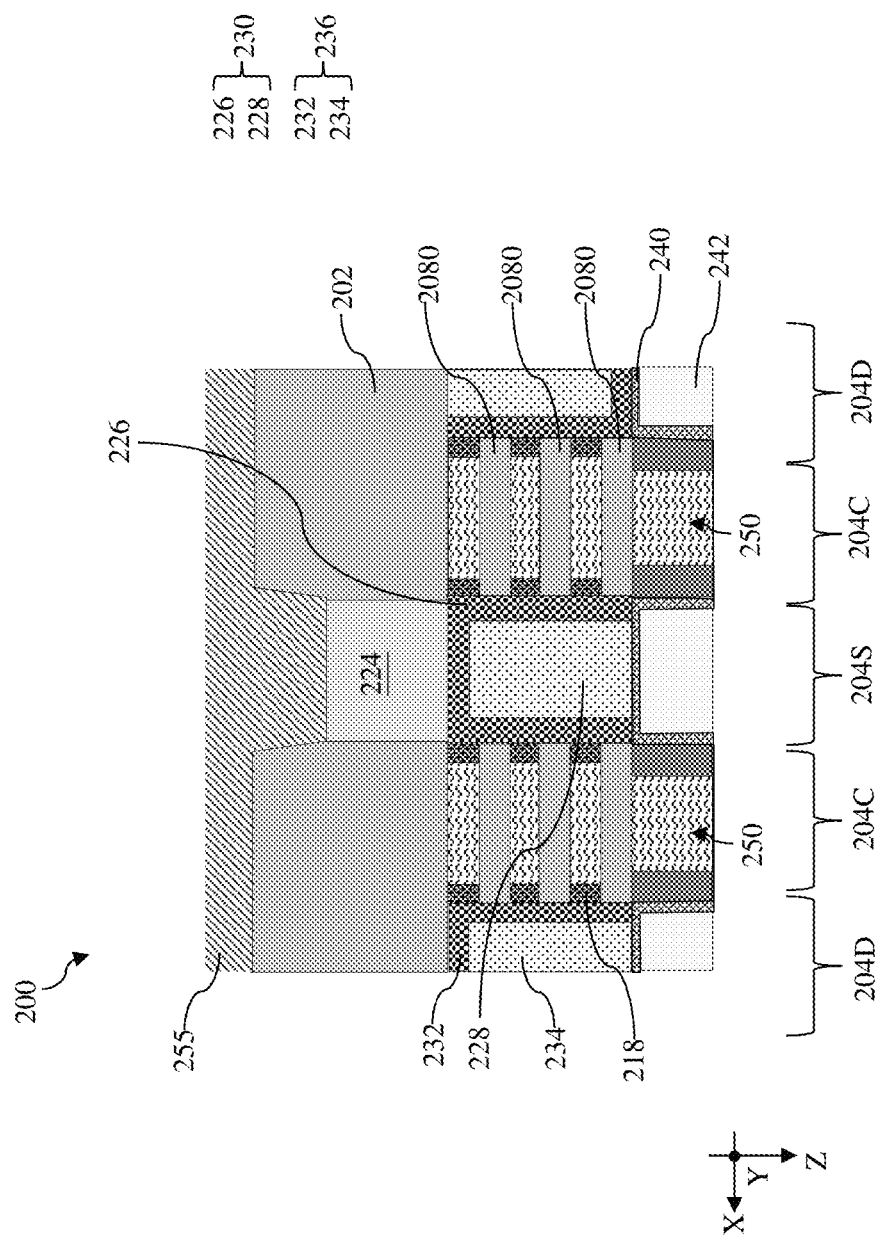
Figure 16:
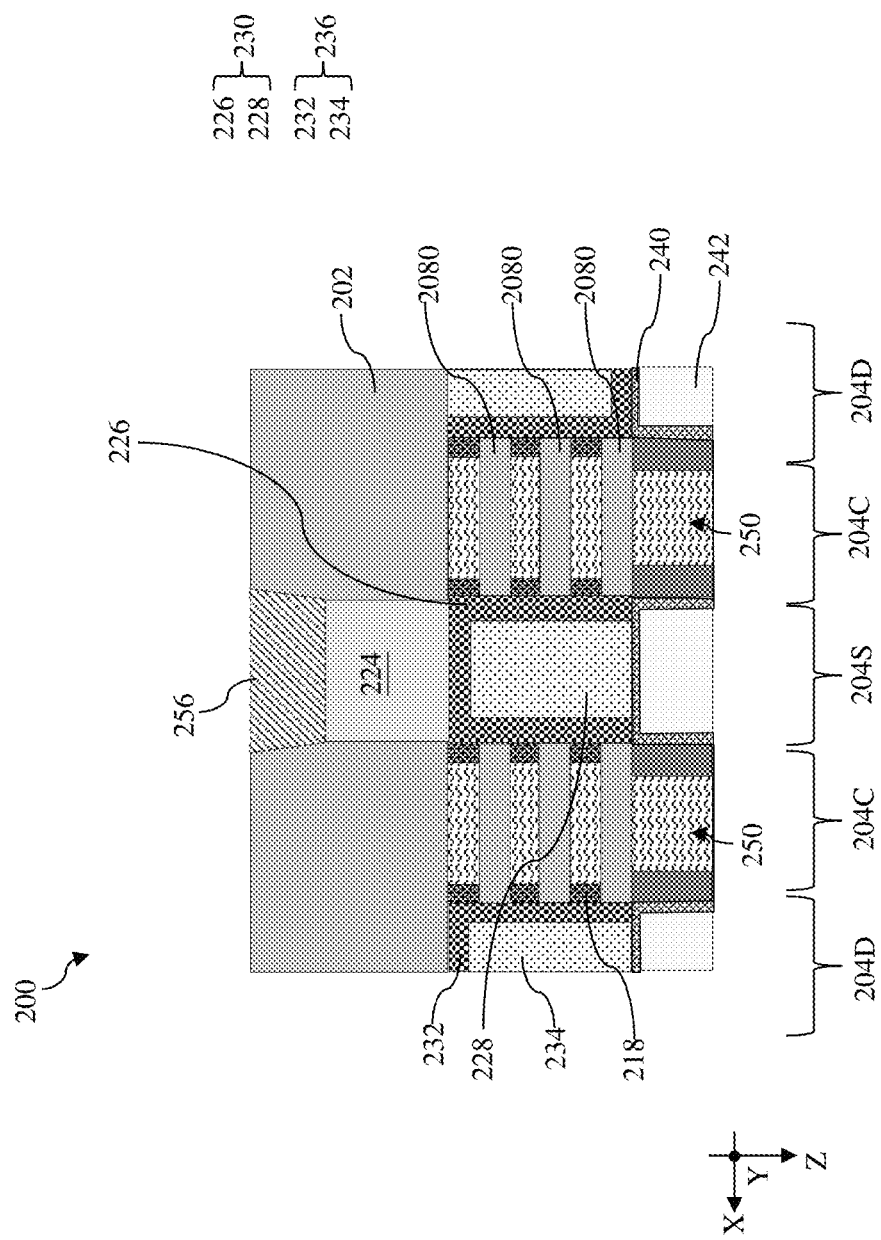

Referring to FIGS. 1, 14, 15, and 16, method 100 includes a block 124 where a hard mask feature 256 is formed over the semiconductor plug 224. Operations at block 124 may include a top corner rounding process (shown in FIG. 14), deposition of a hard mask layer 255 (shown in FIG. 15), and etch back of the hard mask layer 255 to form the hard mask feature 256 (shown in FIG. 16). Reference is made to FIG. 14. In some embodiments, angled implantation and plasma etching may be performed to round the top corners of the recess 252, thereby forming a tapered recess 254. The tapered recess 254 includes sidewalls that taper along the depth of the tapered recess 254 into the substrate 202. The formation of the tapered recess 254 may be referred to as a top corner rounding process. Referring now to FIG. 15, the hard mask layer 255 is deposited over the back side of the workpiece 200, including over the tapered recess 254 and the substrate 202. In some implementations, the hard mask layer 255 may be deposited using PECVD, CVD, ALD, PEALD, or a suitable deposition method. The hard mask layer 255 may include silicon nitride, silicon carbonitride, silicon carbide, or metal oxide. The deposited hard mask layer 255 is then etched back until the substrate 202 is exposed, as illustrated in FIG. 16. At the conclusion of the etch back of the hard mask layer 255, the hard mask feature 256 is formed in the tapered recess 254. The hard mask feature 256 tracks the profile of the tapered recess 254 and may include tapered sidewalls.

Figure 17:
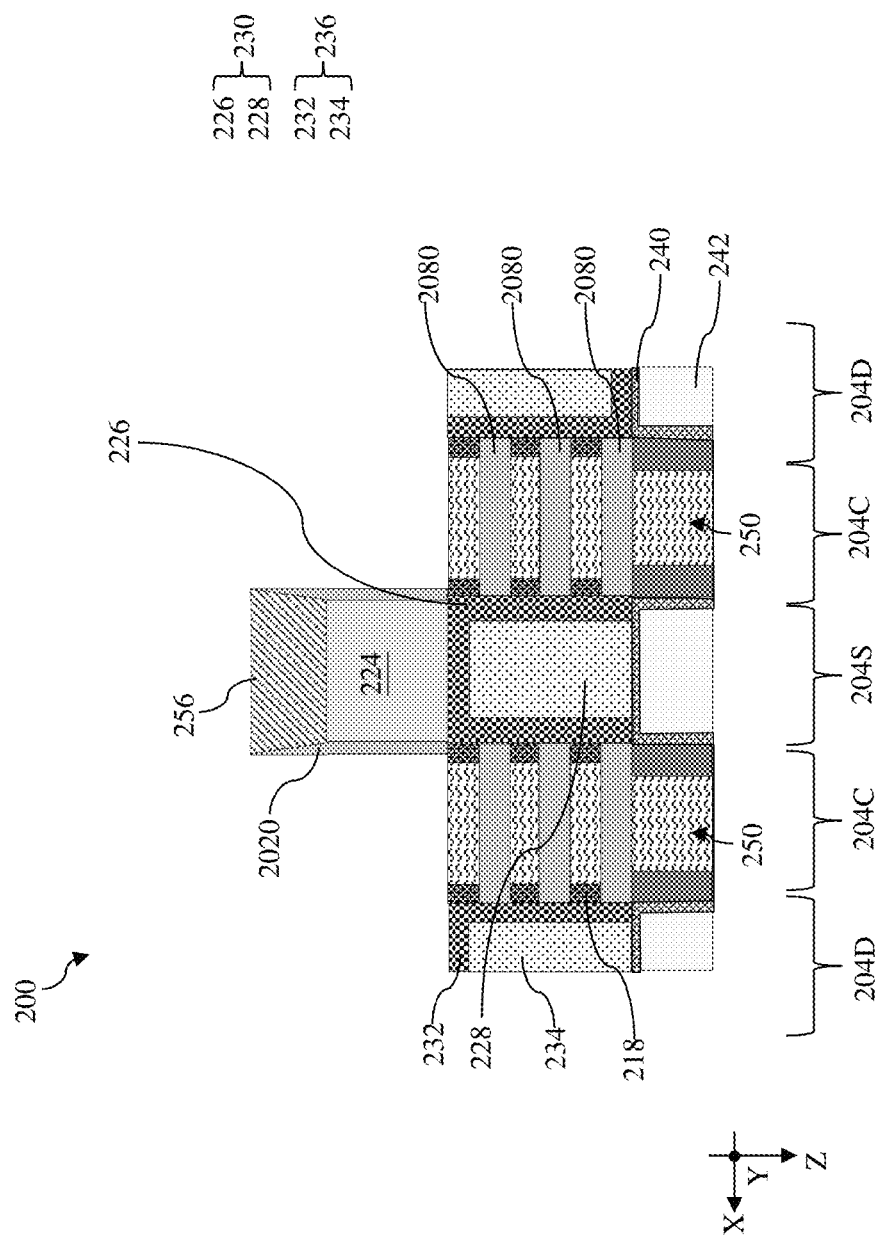
Figure 18:
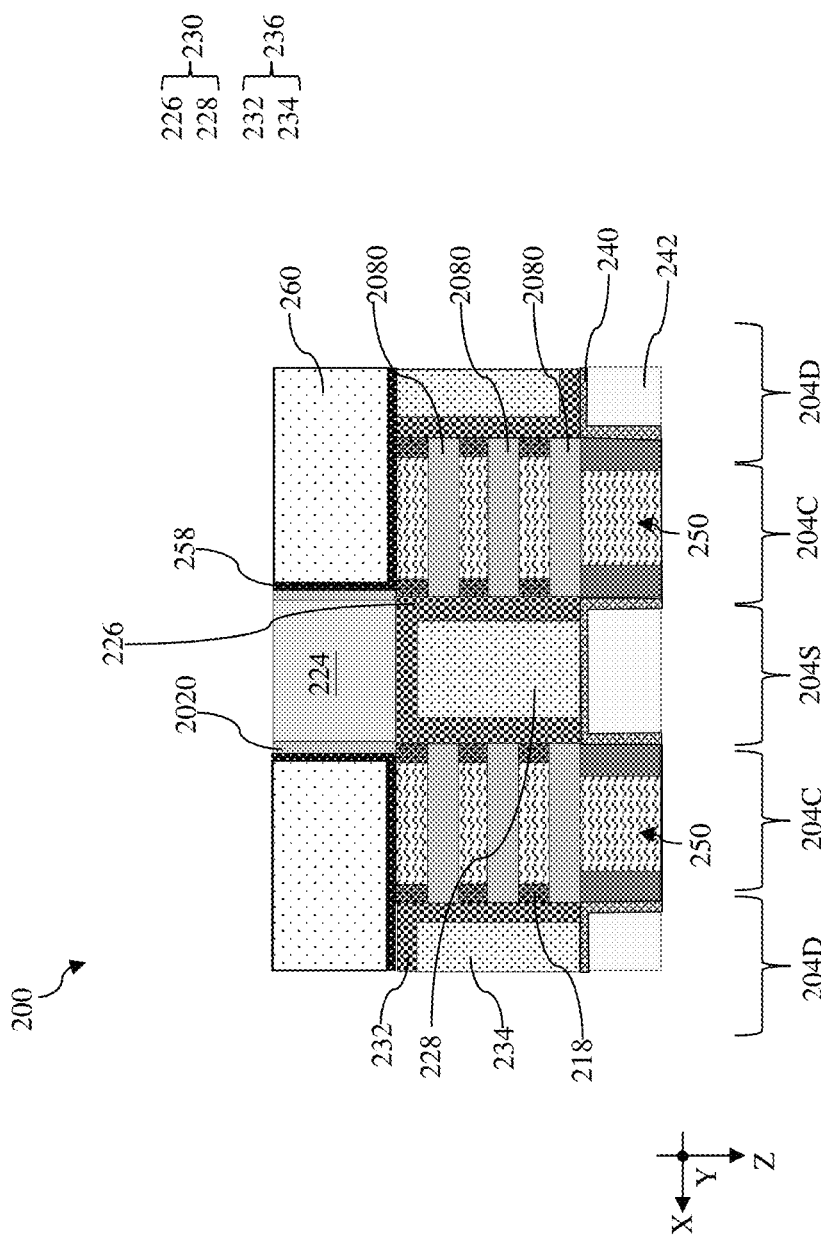

Referring to FIGS. 1, 17 and 18, method 100 includes a block 126 where the substrate 202 is replaced with a backside dielectric layer 260. The replacement process includes a removal of the substrate 202 and deposition of the backside dielectric layer 260 in place of the removed substrate 202. Referring to FIG. 17, with the hard mask feature 256 protecting the semiconductor plug 224, an anisotropic etch process may be performed to etch away the substrate 202 that is not protected by the hard mask feature 256. An example anisotropic etch process may include use of plasma of a fluorine-containing gas (e.g., $CF_4$, $SF_6$, $CH_2F_2$, $CHF_3$, and/or $C_2F_6$), a chlorine-containing gas (e.g., $C_{12}$, $CHCl_3$, $CCl_4$, and/or $BCl_3$), a bromine-containing gas (e.g., HBr and/or $CHBR_3$), an iodine-containing gas, a halogen fluoride gas mixture, other suitable gases and/or plasmas, and/or combinations thereof. In some instances, the chemistry of the anisotropic etch process is selected such that it etches dielectric material and gate structures 250 at a slower rate. As shown in FIG. 17, the anisotropic etch process is performed until the gate structures 250 are exposed. In some embodiments, due to the tapered sidewalls of the hard mask feature 256, a sidewall portion 2020 of the substrate 202 may remain at the conclusion of the anisotropic etch process.

Referring to FIG. 18, after the substrate 202 is removed, the backside dielectric layer 260 may be deposited over a back side of the workpiece 200 by FCVD, CVD, PECVD, spin-on coating, or a suitable process. The backside dielectric layer 260 may include silicon oxide or a composition similar to that of the first ILD layer 242. After the formation of the backside dielectric layer 260, the back side of the workpiece 200 is planarized by a CMP process to remove the hard mask feature 256 and to expose surfaces of the sidewall portion 2020 and the semiconductor plug 224, as shown in FIG. 18. In some embodiments represented in FIG. 18, before the deposition of the backside dielectric layer 260, a protective liner 258 may be deposited over the backside of the workpiece 200, including over the sidewall portion 2020, the gate structures 250, the bottommost inner spacer features 218, and the drain features 236. In some embodiments, the protective liner 258 may include silicon nitride or silicon carbonitride and may be deposited using CVD, ALD, or a suitable deposition technique.

Figure 19:
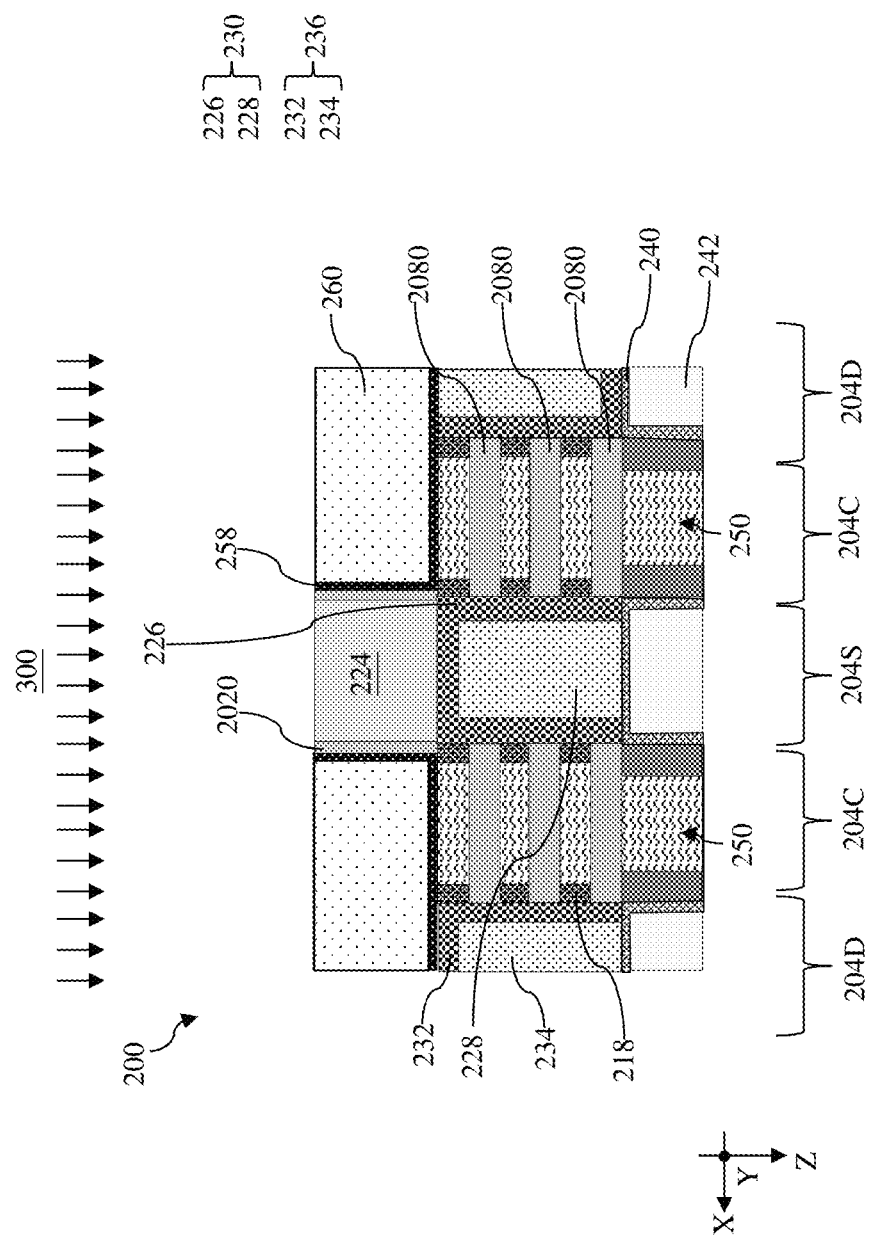

Referring now to FIGS. 1 and 19-22, method 100 includes a block 128 where the semiconductor plug 224 is converted to a backside source contact 264. Operations at block 128 include performing a pre-silicide implantation process 300 (shown in FIG. 19), deposition of a silicide precursor 262 over the workpiece 200 (shown in FIG. 20), performing a first anneal process 400 (shown in FIG. 21), removal of excess silicide precursor (shown in FIG. 22), and performing a second anneal process 500 (shown in FIG. 22). Referring first to FIG. 19, the pre-silicide implantation process 300 may implant a semiconductor species, such as germanium (Ge), in the semiconductor plug 224 and the sidewall portions 2020 to provide a more uniform germanium distribution that is conducive to satisfactory silicide formation. In some embodiments, after the pre-silicide implantation process 300, the workpiece 200 is subject to a pre-clean process. The pre-clean process may include use of plasma of argon (Ar), hydrogen ($H_2$), ammonia ($NH_3$), nitrogen trifluoride ($NF_3$), or a combination thereof. and is aimed to remove undesirable debris from the back side of the workpiece 200.

Figure 20:
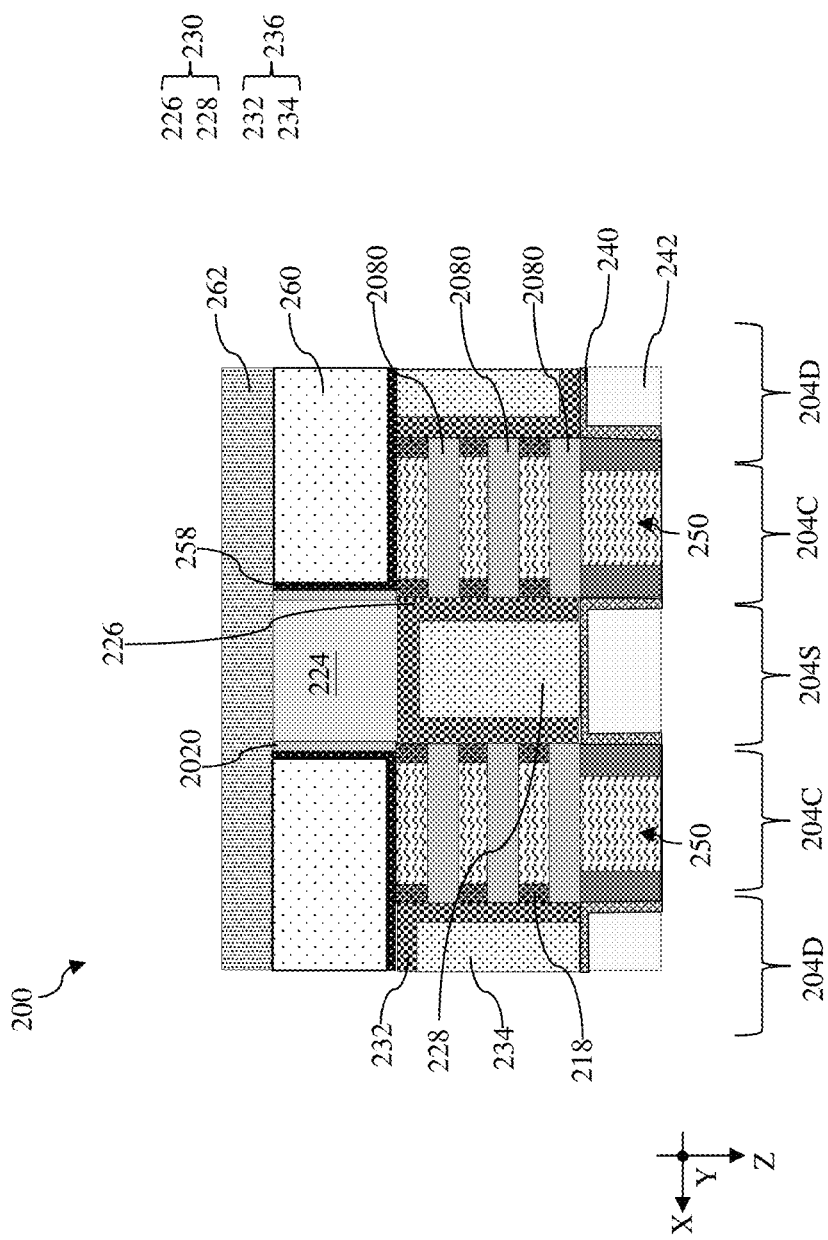

After the pre-silicide implantation process 300 and the pre-clean process, the silicide precursor 262 is deposited over the back side of the workpiece 200 to be in contact with the semiconductor plug 224 and the sidewall portions 2020, as shown in FIG. 20. In some embodiments, the silicide precursor 262 may include a metal that may react with silicon to form a metal silicide. In some instances, the silicide precursor 262 may include nickel (Ni), platinum (Pt), or titanium (Ti). In one embodiment, the silicide precursor 262 includes nickel (Ni) due to nickel's high diffusivity in silicon and the conductive properties of the resulting nickel silicide. In some implementations, the silicide precursor 262 may be deposited using physical vapor deposition (PVD) or chemical vapor deposition (CVD). As shown in FIG. 20, the deposited silicide precursor 262 is direct contact with the backside dielectric layer 260, the protective liner 258, the sidewall portion 2020, and the semiconductor plug 224.

Figure 21:
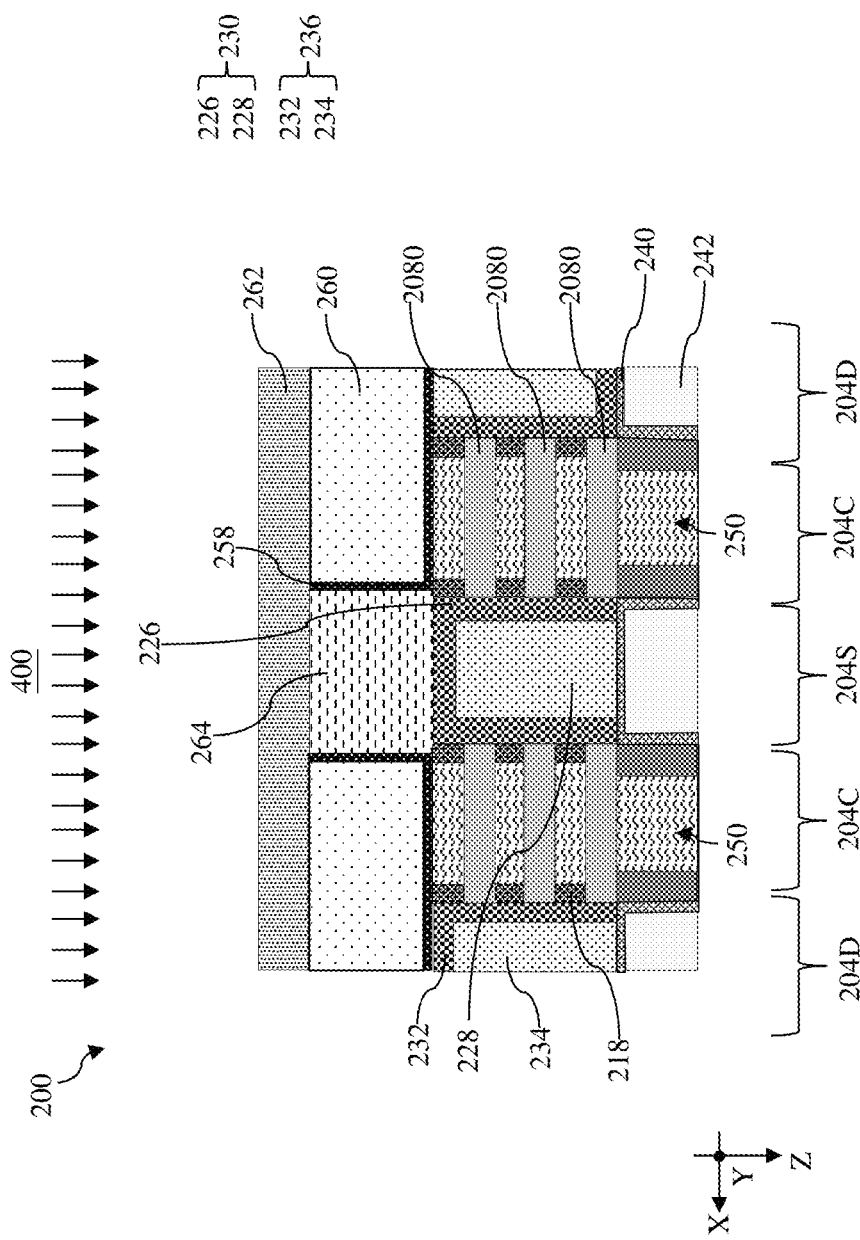

Reference is made to FIG. 21. After the deposition of the silicide precursor 262, the first anneal process 400 is performed to bring about silicidation reaction between the silicide precursor 262, on the one hand, and the semiconductor plug 224 and the sidewall portion 2020, on the other hand. In some embodiments, the first anneal process 400 may be a rapid thermal anneal (RTA) process, a laser spike anneal process, a flash anneal process, or a furnace anneal process. The first anneal process 400 may include an anneal temperature between about 200° C. and about 300° C. Such an anneal temperature is selected to facilitate diffusion of the silicide precursor 262 into the semiconductor plug 224 and the sidewall portion 2020 and to promote silicidation reaction between the silicide precursor 262 and the semiconductor plug 224 as well as the sidewall portion 2020. At the conclusion of the first anneal process 400, the non-conductive semiconductor plug 224 is converted into the backside source contact 264, which is electrically conductive. The backside source contact 264 may include nickel silicide, platinum silicide, or titanium silicide, as well as germanium.

Figure 22:
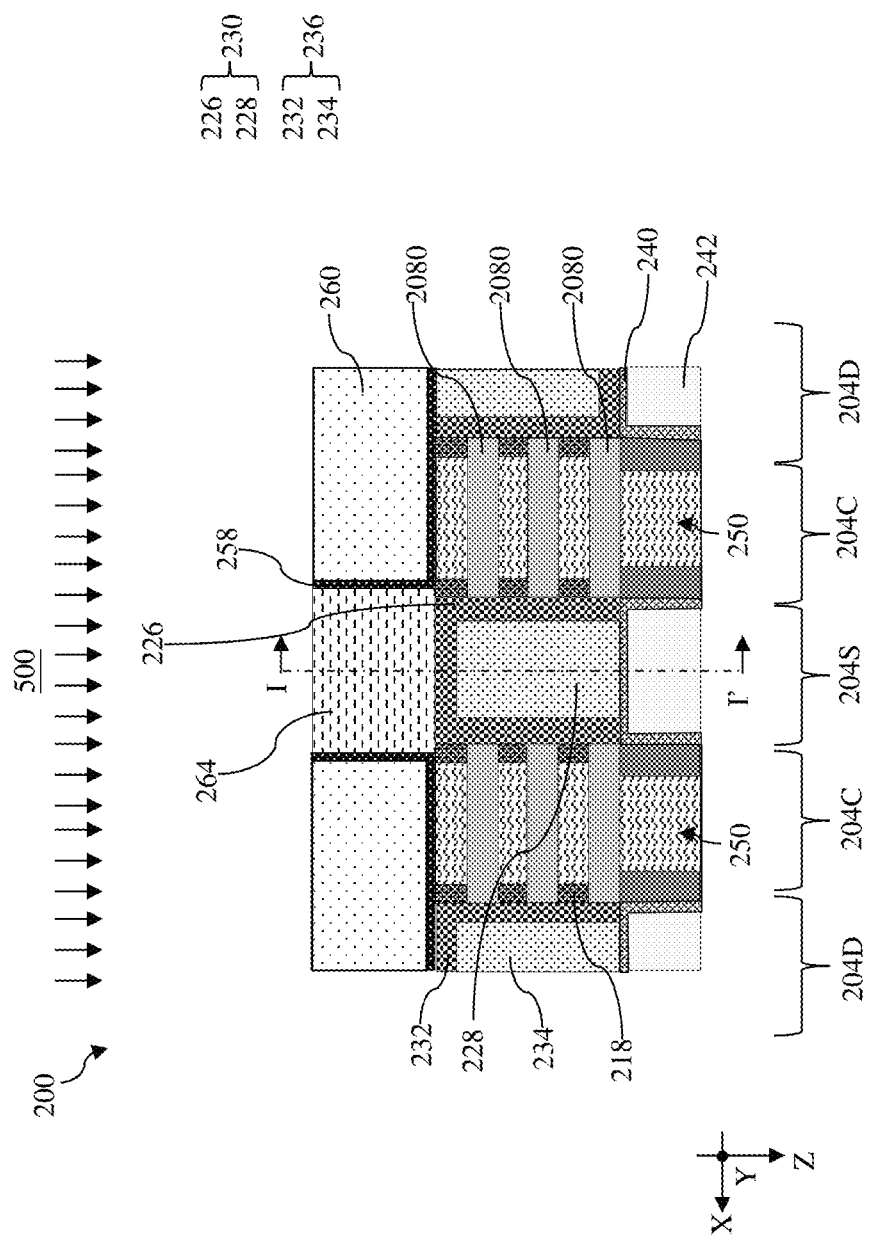

Referring to FIG. 22, block 128 also includes removal of the excess silicide precursor 262 after the first anneal process 400. In some embodiments, the excess silicide precursor 262 may be removed by a wet etch process until the backside dielectric layer 260 and the backside source contact 264 are exposed. The wet etch process here may include chemistry that is selective to the silicide precursor 262. In some instances, the wet etch process may include use of hydrogen peroxide ($H_2O_2$), hydrofluoric acid (HF), nitric acid ($HNO_3$), hydrochloric acid (HCl), sulfuric acid ($H_2SO_4$) or a ferric chloride ($FeCl_3$) solution. With the backside source contact 264 exposed from the back side of the workpiece 200, a second anneal process 500 is performed to activate the backside source contact 264 by enriching a more electrically conductive phase of the metal silicide in the backside source contact 264. For example, when the backside source contact 264 is formed of nickel silicide, the second anneal process 500 is performed to enrich the NiSi, $Ni_2Si$, or $NiSi_2$ phases that are more electrically conductive (less electrically resistive). In some embodiments, the second anneal process 500 may be a rapid thermal anneal (RTA) process, a laser spike anneal process, a flash anneal process, or a furnace anneal process. The second anneal process 500 may include an anneal temperature greater than the anneal temperature of the first anneal process. In some instances, the anneal temperature of the second anneal process 500 may be between about 300° C. and about 400° C.

Figure 23:
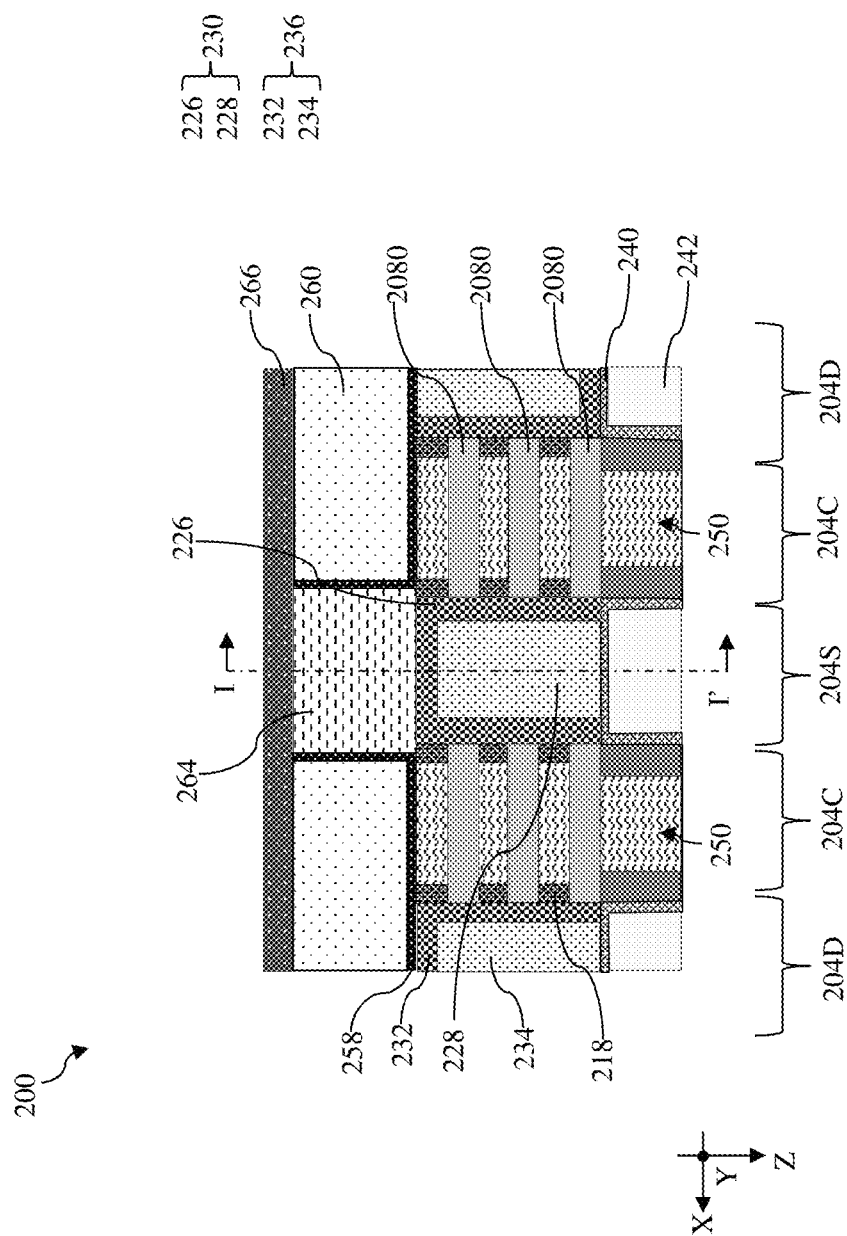
Figure 24:
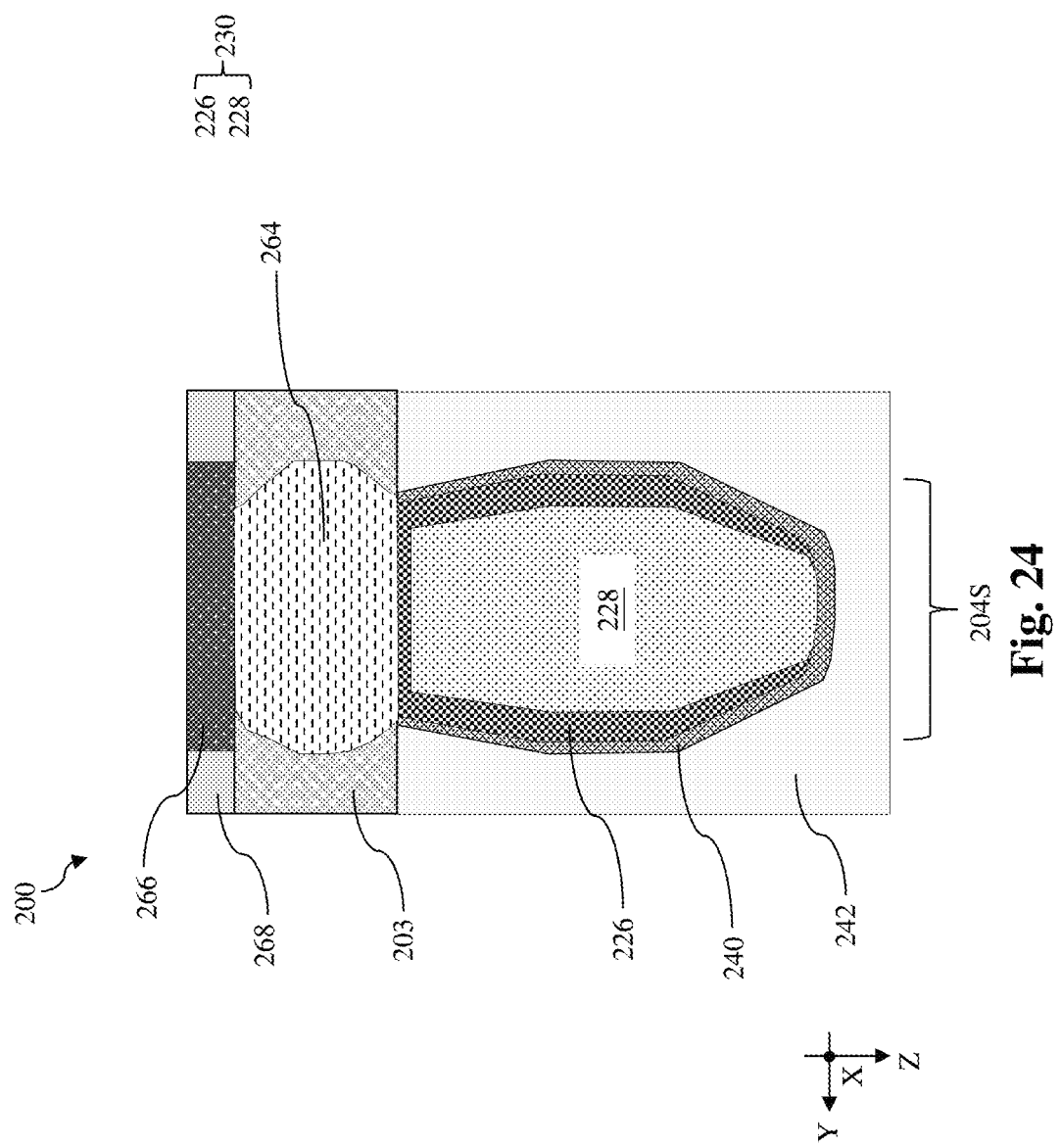
Figure 25:
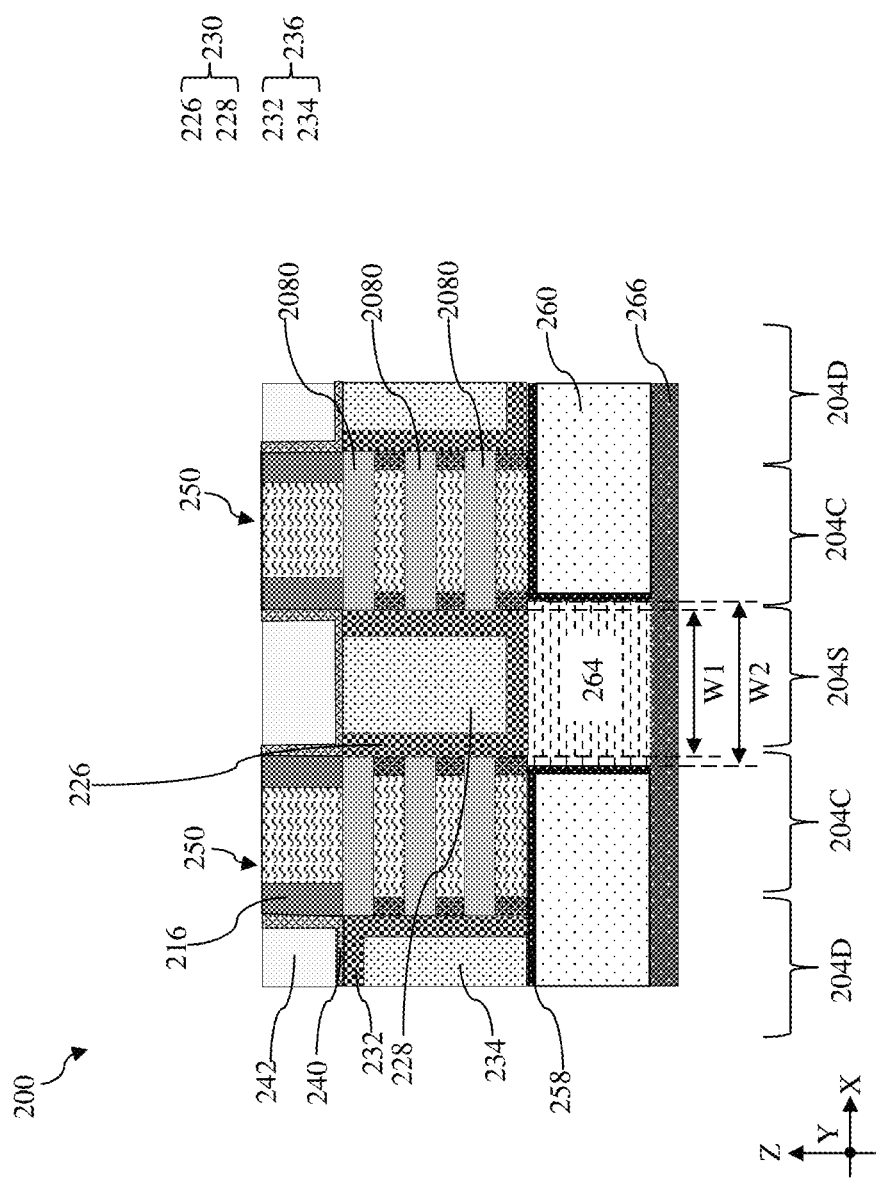

Referring to FIGS. 1, 23, 24, and 25, method 100 includes a block 130 where a backside power rail 266 is formed. FIG. 24 illustrates a cross-sectional view of the source region 204S along section I-I' in FIG. 23. FIG. 25 illustrates a cross-sectional view of the workpiece 200 in FIG. 23 after the workpiece 200 is flipped over. The backside power rail 266 may be embedded in an insulation layer 268 shown in FIG. 24. In some embodiments, the insulation layer 268 may have a composition similar to the first ILD layer 242 and may be deposited over the back side of the workpiece 200, including over the backside dielectric layer 260, the protective liner 258, the isolation feature, and the backside source contact 264, using spin-on coating, FCVD, or CVD. Then, a power rail trench may be patterned in the insulation layer 268. A barrier layer and a metal fill material are then deposited into the power rail trench to form the backside power rail 266. In some embodiments, the barrier layer in the backside power rail 266 may include titanium nitride, tantalum nitride, cobalt nitride, nickel nitride, or tungsten nitride and the metal fill material in the backside power rail 266 may include titanium (Ti), ruthenium (Ru), copper (Cu), nickel (Ni), cobalt (Co), tungsten (W), tantalum (Ta), or molybdenum (Mo). The barrier layer and the metal fill layer may be deposited using PVD, CVD, ALD, or electroless plating. A planarization process, such as a CMP process, may be performed to remove excess materials over the insulation layer. The backside power rail 266 is in direct contact with and electrically coupled to the backside source contact 264, as shown in FIGS. 23, 24 and 25.

Reference is still made to FIGS. 23, 24 and 25. In some embodiments, although the sidewalls of the backside source contact 264 may appear substantially straight along the protective liner 258, sidewalls of the backside source contact 264 may balloon or expand sideways into the isolation feature 203. Such sideway expansion is a result of sideway erosion or etching at block 108 when the extended source opening 2220 is formed. In some instances, the formation of the extended source opening 2220 may also etch the isolation feature 203 and expand the extended source opening 2220 sideways into the isolation feature 203. The semiconductor plug 224 that is deposited into the extended source opening 2220 inherits such balloon or sideway-expansion shape. The semiconductor plug 224 is later converted into the backside source contact 264. FIGS. 22 and 23 also illustrate how the backside source contact 264 engages adjacent structures. As shown in FIG. 22, the backside source contact 264 is in direct contact with the protective liner 258 but is spaced apart from the backside dielectric layer 260. As shown in FIG. 23, the backside source contact 264 is in direct contact with the isolation feature 203. The protective liner 258 does not extend between the backside source contact 264 and the isolation feature 203.

Referring to FIG. 25, the source feature 230 includes a first width W1 along the X direction and the backside source contact 264 includes a second width W2 along the X direction. Because the backside source contact 264 is converted from not only the semiconductor plug 224 but also the sidewall portions 2020, the second width W2 is greater than the first width W1. In some instances, the first width W1 may be between about 12 nm and about 16 nm and the second width W2 may be between about 16 nm and about 22 nm. In some embodiments represented in FIG. 25, the backside source contact 264 may come in contact with the bottom-most (closer to the backside dielectric layer 260) inner spacer features 218.

Embodiments of the present disclosure provide advantages. Methods of the present disclosure form a metal silicide backside source contact without the risk of damaging the source/drain feature. To form a backside source contact using methods of the present disclosure, a semiconductor plug is deposited in an extended source opening that extends into a substrate of a workpiece. After the semiconductor plug is exposed from a back side of the substrate and the substrate is replaced with a backside dielectric layer, the semiconductor plug is converted into an electrically conductive backside source contact. Throughout the process, the semiconductor plug is not removed and the source/drain feature is not exposed to etchants from the back side. Methods of the present disclosure therefore avoid potential damages to the source/drain feature.

In one exemplary aspect, the present disclosure is directed to a semiconductor device. The semiconductor device includes a first plurality of channel members over a backside dielectric layer, a second plurality of channel members over the backside dielectric layer, a silicide feature disposed in the backside dielectric layer, and a source/drain feature disposed over the silicide feature and extending between the first plurality of channel members and the second plurality of channel members. The silicide feature extends through an entire depth of the backside dielectric layer.

In some embodiments, the semiconductor device may further include a backside metal line underlying the backside dielectric layer. The silicide feature extends between the backside metal line and the source/drain feature. In some implementations, the silicide feature includes nickel silicide, platinum silicide, or titanium silicide. In some instances, the semiconductor device may further include a dielectric liner disposed between the silicide feature and the backside dielectric layer. In some embodiments, the dielectric liner includes silicon nitride or silicon carbonitride and the backside dielectric layer includes silicon oxide. In some embodiments, the semiconductor device may further include an isolation feature adjacent the backside dielectric layer. The isolation feature is in direct contact with the silicide feature. In some instances, the source/drain feature extends between the first plurality of channel members and the second plurality of channel members along a direction. The silicide feature includes a first width along the direction and the source/drain feature includes a second width along the direction. The first width is greater than the second width. In some embodiments, the semiconductor device may further include a plurality of inner spacer features interleaving the first plurality of channel members. The silicide feature is in contact with a bottommost inner spacer feature of the plurality of inner spacer features.

In another exemplary aspect, the present disclosure is directed to a semiconductor structure. The semiconductor structure includes a backside metal line, a silicide feature disposed on and in contact with the backside metal line, a source/drain feature disposed on the silicide feature, a contact etch stop layer (CESL) disposed on the source/drain feature, and a dielectric layer disposed over the CESL.

In some embodiments, the silicide feature includes nickel silicide, platinum silicide, or titanium silicide. In some implementations, the CESL includes silicon nitride or silicon carbonitride and the dielectric layer includes silicon oxide. In some embodiments, the source/drain feature includes an outer epitaxial layer and an inner epitaxial layer over the outer epitaxial layer. In some implementations, the source/drain feature extends between a first plurality of channel members and a second plurality of channel members along a direction. In some instances, the silicide feature includes a first width along the direction, the source/drain feature includes a second width along the direction, and the first width is greater than the second width. In some embodiments, the silicide feature includes silicon and germanium.

In yet another exemplary aspect, the present disclosure is directed to a method. The method includes receiving a workpiece that includes a fin-shaped structure over a substrate, the fin-shaped structure including a plurality of channel layers, and a first dummy gate stack and a second dummy gate stack over the fin-shaped structure. The method further includes forming a source opening in the fin-shaped structure between the first dummy gate stack and the second dummy gate stack to expose sidewalls of the fin-shaped structure, extending the source opening into the substrate to form an extended source opening, forming a semiconductor plug into the extended source opening, forming a source feature over the exposed sidewalls of the plurality of channel layers and the semiconductor plug in the extended source opening, planarizing the substrate to expose the semiconductor plug, after the planarizing, replacing the substrate with a backside dielectric layer, depositing a metal layer over the backside dielectric layer and the exposed semiconductor plug, and performing an anneal process to bring about silicidation between the metal layer and the exposed semiconductor plug.

In some embodiments, the semiconductor plug includes silicon germanium (SiGe). In some implementations, the metal layer includes nickel, platinum, or titanium. In some instances, the replacing of the substrate includes etching back the exposed semiconductor plug, forming a hard mask feature over the etched-back semiconductor plug, and anisotropically etching the substrate using the hard mask feature as an etch mask. In some instances, the anisotropically etching leaves behind a portion of the substrate extending along sidewalls of the etched-back semiconductor plug and the anneal process further brings about silicidation between the metal layer and the portion of the substrate.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a first plurality of channel members over a first portion of a backside dielectric layer;

a second plurality of channel members over a second portion of the backside dielectric layer;
a silicide feature disposed between the first portion and the second portion of the backside dielectric layer along a direction; and
a source/drain feature disposed over the silicide feature and extending between the first plurality of channel members and the second plurality of channel members along the direction,
wherein the silicide feature extends through an entire depth of the backside dielectric layer,
wherein the silicide feature directly between the first portion and the second portion of the backside dielectric layer has a first width along the direction,
wherein the source/drain feature comprises a second width along the direction,
wherein the first width is greater than the second width.

2. The semiconductor device of claim 1, further comprising:
a backside metal line underlying the backside dielectric layer,
wherein the silicide feature extends between the backside metal line and the source/drain feature.

3. The semiconductor device of claim 1, wherein the silicide feature comprises nickel silicide, platinum silicide, or titanium silicide.

4. The semiconductor device of claim 1, further comprising:
a dielectric liner disposed between the silicide feature and the backside dielectric layer.

5. The semiconductor device of claim 4,
wherein the dielectric liner comprises silicon nitride or silicon carbonitride,
wherein the backside dielectric layer comprises silicon oxide.

6. The semiconductor device of claim 1, further comprising:
an isolation feature adjacent the backside dielectric layer,
wherein the isolation feature is in direct contact with the silicide feature.

7. The semiconductor device of claim 1,
wherein the first width is between about 16 nm and about 22 nm,
wherein the second width is between about 12 nm and about 16 nm.

8. The semiconductor device of claim 1, further comprising:
a plurality of inner spacer features interleaving the first plurality of channel members,
wherein the silicide feature is in contact with a bottommost inner spacer feature of the plurality of inner spacer features.

9. A semiconductor structure, comprising:
a backside metal line;
a backside dielectric layer disposed over the backside metal line;
a silicide feature extending through the backside dielectric layer to be in contact with the backside metal line;
a protective liner extending continuously from between the silicide feature and a sidewall of the backside dielectric layer to a top surface of the backside dielectric layer;
a source/drain feature disposed on the silicide feature;
a contact etch stop layer (CESL) disposed on the source/drain feature; and
a dielectric layer disposed over the CESL.

10. The semiconductor structure of claim 9, wherein the silicide feature comprises nickel silicide, platinum silicide, or titanium silicide.

11. The semiconductor structure of claim 9,
wherein the CESL comprises silicon nitride or silicon carbonitride,
wherein the dielectric layer comprises silicon oxide.

12. The semiconductor structure of claim 9, wherein the source/drain feature comprises:
an outer epitaxial layer; and
an inner epitaxial layer over the outer epitaxial layer.

13. The semiconductor structure of claim 9, wherein the source/drain feature extends between a first plurality of channel members and a second plurality of channel members along a direction.

14. The semiconductor structure of claim 13,
wherein the silicide feature in the backside dielectric layer and below the backside metal line comprises a first width along the direction,
wherein the source/drain feature comprises a second width along the direction, and
wherein the first width is greater than the second width.

15. The semiconductor structure of claim 9, wherein the silicide feature comprises silicon and germanium.

16. A semiconductor structure, comprising:
a backside metal line extending lengthwise along a direction;
a backside dielectric layer disposed on the backside metal line;
a silicide feature extending through the backside dielectric layer and in direct contact with the backside metal line;
a first gate structure and a second gate structure disposed over the backside dielectric layer; and
a source/drain feature disposed on the silicide feature and between the first gate structure and the second gate structure along the direction,
wherein a first width of the silicide feature between the first gate structure and the second gate structure along the direction is greater than a second width of the source/drain feature along the direction.

17. The semiconductor structure of claim 16,
wherein the first width is between about 16 nm and about 22 nm,
wherein the second width is between about 12 nm and about 16 nm.

18. The semiconductor structure of claim 16, wherein the silicide feature comprises nickel silicide, platinum silicide, titanium silicide, or germanium.

19. The semiconductor structure of claim 16, wherein the backside dielectric layer comprises silicon oxide.

20. The semiconductor structure of claim 16,
wherein the silicide feature is spaced apart from the backside dielectric layer by a liner,
wherein the liner comprises silicon nitride or silicon carbonitride.

* * * * *